US007859065B2

United States Patent
Takeuchi et al.

(10) Patent No.: US 7,859,065 B2
(45) Date of Patent: Dec. 28, 2010

(54) FIN-TYPE FIELD EFFECT TRANSISTOR AND SEMICONDUCTOR DEVICE

(75) Inventors: Kiyoshi Takeuchi, Tokyo (JP); Katsuhiko Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 348 days.

(21) Appl. No.: 11/921,685

(22) PCT Filed: Jun. 5, 2006

(86) PCT No.: PCT/JP2006/311200

§ 371 (c)(1), (2), (4) Date: Dec. 6, 2007

(87) PCT Pub. No.: WO2006/132172

PCT Pub. Date: Dec. 14, 2006

(65) Prior Publication Data

US 2009/0134454 A1    May 28, 2009

(30) Foreign Application Priority Data

Jun. 7, 2005    (JP) .............................. 2005-166767

(51) Int. Cl.
*H01L 27/088* (2006.01)

(52) U.S. Cl. ............... 257/401; 257/347; 257/E29.298; 257/E29.274

(58) Field of Classification Search ............. 257/347, 257/401, E29.274, E21.442
See application file for complete search history.

(56) References Cited

U.S. PATENT DOCUMENTS

2005/0074972 A1 * 4/2005 Saito ........................ 438/689

2006/0138553 A1 * 6/2006 Brask et al. ................. 257/369

FOREIGN PATENT DOCUMENTS

| JP | 64-8670 | 1/1989 |
|---|---|---|
| JP | 5-21454 A | 1/1993 |
| JP | 10-294453 A | 11/1998 |
| JP | 2002-9289 | 1/2002 |
| JP | 2005-116633 A | 4/2005 |
| WO | 2005/022637 A1 | 3/2005 |
| WO | 2005/038931 A1 | 4/2005 |
| WO | 2005/091374 A1 | 9/2005 |
| WO | 2005/122272 A1 | 12/2005 |
| WO | 2005/122276 A1 | 12/2005 |
| WO | 2006/006424 A1 | 1/2006 |
| WO | 2006/011369 A1 | 2/2006 |

* cited by examiner

*Primary Examiner*—Jerome Jackson, Jr.
*Assistant Examiner*—Paul A Budd
(74) *Attorney, Agent, or Firm*—Young & Thompson

(57) ABSTRACT

A constant distance can be maintained between source/drain regions without providing a gate side wall by forming a gate electrode comprising an eaves structure, and a uniform dopant concentration is kept within a semiconductor by ion implantation. As a result, a FinFET excellent in element properties and operation properties can be obtained. A field effect transistor, wherein a gate structure body is a protrusion that protrudes toward source and drain regions sides in a channel length direction and has a channel length direction width larger than that of the part adjacent to the insulating film in a gate electrode, and the protrusion comprises an eaves structure formed by the protrusion that extends in a gate electrode extending direction on the top surface of the semiconductor layer.

5 Claims, 22 Drawing Sheets

Fig. 12
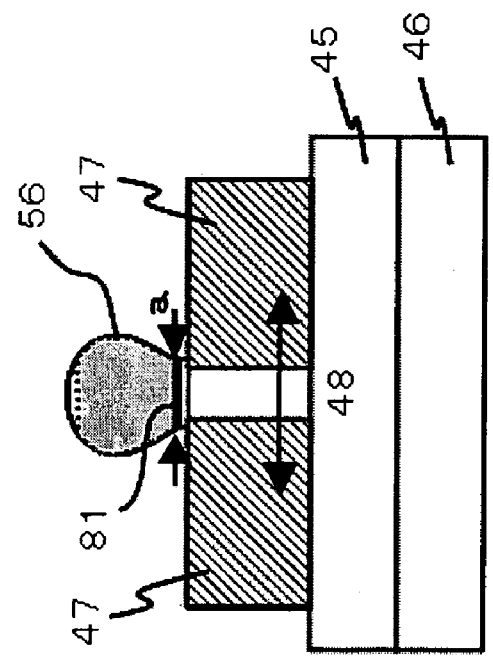
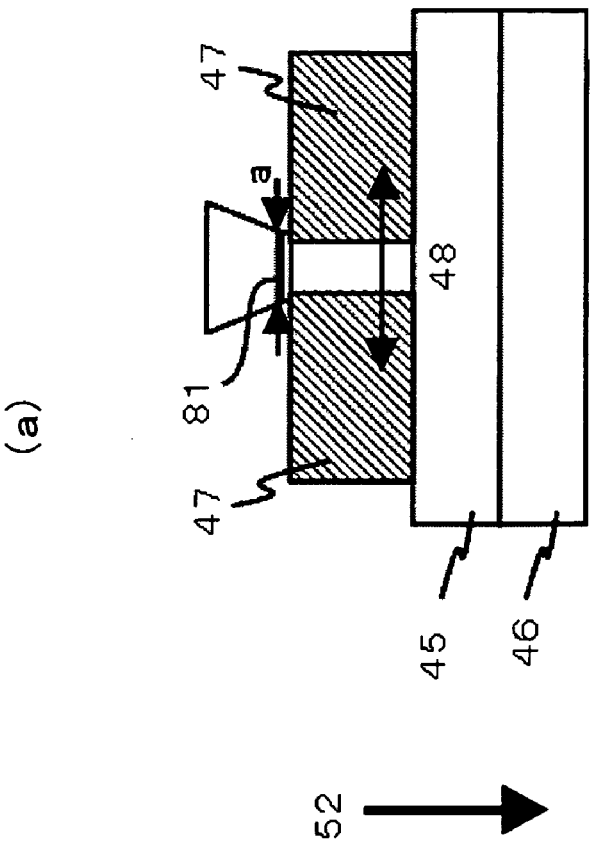

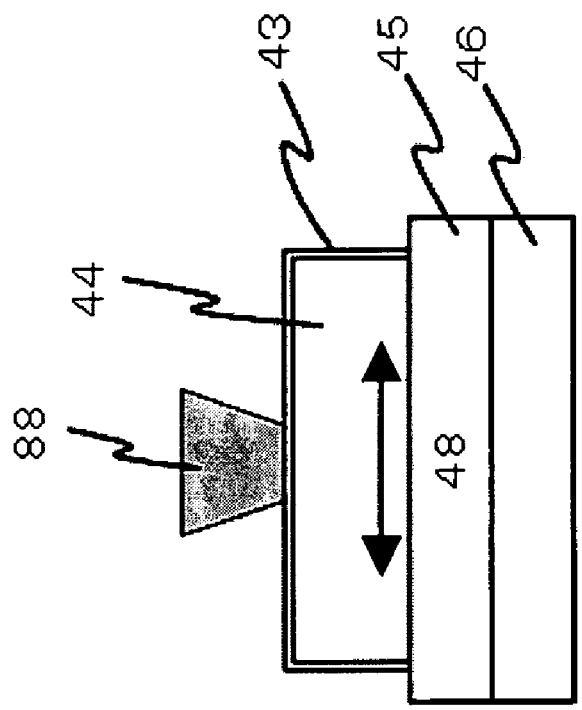
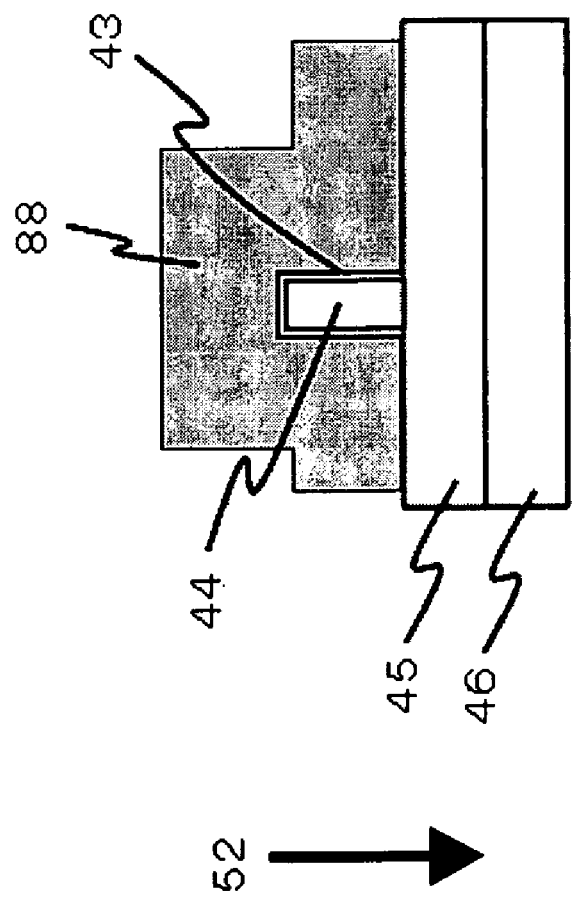
Fig. 15

FIN-TYPE FIELD EFFECT TRANSISTOR AND SEMICONDUCTOR DEVICE

TECHNICAL FIELD

The present invention relates to a fin-type field effect transistor having excellent element properties and operation properties, a semiconductor device and a manufacturing process therefor.

BACKGROUND OF THE INVENTION

In the field of a semiconductor device, there have been used planar field effect transistors (hereinafter, referred to as a "planar MOSFET"). Such a planar MOSFET ensures a substantial channel length by controlling a distance between source/drain regions, allowing a gate side wall to be formed in the side of a gate electrode.

FIGS. 1(a) to (c) show a process for forming a gate side wall in a planar MOSFET. FIG. 1 shows a cross section parallel to a channel length direction of a planar MOSFET and perpendicular to a substrate plane. In this process, first, an insulating film 11 and a gate electrode 12 are formed on a semiconductor substrate, and then an insulating film 13 for a gate side wall is laminated over the whole surface (FIG. 1(a)). Next, it is etched back for removing the insulating film layer other than that in the side face of the gate electrode 12 to form a gate side wall 14. Then, using the gate electrode 12 and the gate side wall 14 as a mask, a dopant is ion-implanted (FIG. 1(b)) to form a source/drain region 15 (FIG. 1(c)). In this planar MOSFET, the gate side wall can act as a spacer to ensure a constant distance between source/drain regions and thus to ensure a substantial channel length.

Recently, there has been suggested a field effect transistor (hereinafter, referred to as a "FinFET") comprising a protruding semiconductor layer projecting upward from a substrate plane, where a main channel region is formed in a plane substantially perpendicular to the substrate plane of the protruding semiconductor layer (side surface), for preventing short channel effect associated with size reduction. Japanese Patent Laid-open Publication No. 64-8670 has disclosed a FinFET where a part of a protruding semiconductor layer makes up a part of silicon wafer substrate and a FinFET where a part of a protruding semiconductor layer makes up a part of monocrystalline silicon layer in an SOI substrate. The former and the latter structures will be described with reference to FIGS. 2(a) and 2(b), respectively.

In the configuration in FIG. 2(a), a part of a silicon wafer substrate 101 makes up a semiconductor layer 103, and a gate electrode 105 extends to both sides over the top of the semiconductor layer 103. In this semiconductor layer 103, a channel region is formed under an insulating film 104. A width of the channel region corresponds to a 2-fold of a height h of the protrusion 103, while a gate length corresponds to a width L of the gate electrode 105. The gate electrode 105 is formed on an insulating film 102 formed in a trench such that it strides over the semiconductor layer 103.

In the configuration in FIG. 2(b), silicon wafer substrate 111, an SOI substrate comprising an insulating film 112 and a silicon monocrystalline layer is prepared, and its silicon monocrystalline layer is patterned to form a semiconductor layer 113, and a gate electrode 115 is formed on the exposed insulating layer 112 such that it strides over the semiconductor layer 113. In the semiconductor layer 113, a source region and drain region is formed on both sides of the gate electrode, and a channel region are formed under an insulating film 114 (the top surface and the side surface of the semiconductor layer 113). A width of the channel region corresponds to the total of twice a height "a" and a width "b" of the semiconductor layer 113, while a gate length corresponds to a width L of the gate electrode 115.

As described above, FinFET is a field effect transistor where channel regions are formed at least in both sides of a protruding semiconductor layer, having a characteristic that it is generally excellent in prevention of short channel effect.

SUMMARY OF THE INVENTION

In this FinFET, a gate side wall can be also formed in the side surface of a gate electrode for a similar purpose in a planar MOSFET.

FIGS. 3(a) to (d) show a FinFET in which a gate side wall is formed by a conventional manufacturing process. FIG. 3(a) is a plan view of this FinFET, FIG. 3(b) is an A-A' cross-sectional view of the FinFET in FIG. 3(a), FIG. 3(c) is a B-B' cross-sectional view, and FIG. 3(d) is a C-C' cross-sectional view.

This gate side wall is formed by etching back. "Etching back" is a process that after laminating a film over the whole surface of a plane comprising a convex structure, anisotropic etching is conducted to leave only the film laminated on the side surface of the convex structure.

However, depending on the conditions during the etching back, the substrate surface near the gate side wall tends to be damaged, causing increase in a leak current of a transistor.

In a FinFET, not only a gate electrode but also a semiconductor layer makes up a convex structure, so that because of the above features of etching-back, an insulating film remains in the side surface of the semiconductor layer. Such remaining of the insulating film in the side surface of the semiconductor layer makes it difficult to conduct uniformly ion implantation of a dopant in the step of dopant ion-implantation for later forming a source/drain region. It is because of the following reason. When forming a source/drain region of a FinFET, a dopant concentration must be uniform within a semiconductor layer. Thus, a method is employed, where ions are implanted from a direction oblique to a normal line of a substrate. This method permits a dopant to be more uniformly ion-implanted to the bottom of the semiconductor layer. In particular, such tendency is prominent when a semiconductor layer having a larger height (corresponding to "h" in FIG. 1(a) or "a" in FIG. 1(b)).

In the process, when the insulating film remains in the side surface of the semiconductor layer, a dopant amount penetrating the remaining insulating film is reduced, leading to dose loss, particularly for forming a fine transistor requiring low-energy ion implantation, which makes it difficult to provide a semiconductor layer having a required dopant concentration. Furthermore, when an insulating film remains on the side surface of the semiconductor layer in a nonuniform manner, the ion-implanted amount of the dopant becomes nonuniform in a channel width direction (a vertical direction in FIG. 3d). Such a problem is similarly experienced even when a dopant-implanting procedure is changed; for example, a similar problem has been experienced in a method in which dopant implantation is non-directional or less directional such as adsorption doping (a method where after attachment of a dopant to a semiconductor surface, the surface is covered by an insulating film before the dopant is diffused) and plasma doping as well as a method where a dopant is implanted from a direction oblique to a normal line direction of a substrate such as pocket implantation.

For solving such problems, for example, it might be suggested that after forming a gate side wall by a conventional manufacturing process, a mask is applied to a region other than a remaining film on the side surface of the semiconductor layer, the remaining film on the side surface of the semiconductor layer is exclusively removed by anisotropic etching and then a dopant is ion-implanted. However, since the remaining insulating film exists as a continuous element with the gate side wall, the mask formed over the gate side wall inevitably covers a part of the remaining insulating film of the semiconductor layer communicated with the gate side wall. Thus, it is difficult to selectively remove the insulating film formed only in the side of the semiconductor layer.

It might be also suggested that using a sufficiently higher gate electrode than a semiconductor layer, etching back is conducted until a remaining insulating film in the side surface of the semiconductor layer is completely removed. In this method, the gate electrode is sufficiently higher than the semiconductor layer, so that a gate side wall can remain even when etching back is conducted until the insulating film remaining in the side surface of the semiconductor layer disappears. However, the gate electrode is too high to satisfactorily conduct processing such as etching. Furthermore, it may cause many practical problems, including limitation in a height of the semiconductor layer, and insufficient removal of the remaining insulating film around the lower end of the semiconductor layer because the etching back of the remaining insulating film is based on anisotropic etching in a normal-line direction of a substrate plane. As a result, the above method could not provide a FinFET having stable element properties or operation properties.

In view of the above problems, an objective of the present invention is to prevent a substrate from being damaged by forming at least a gate structure body comprising an eaves structure extending over the top surface of a semiconductor layer in a gate electrode extending direction and to ensure a constant distance between source/drain regions without forming a gate side wall for achieving a uniform dopant concentration within the semiconductor layer. Another objective is, as a result, to provide a FinFET having excellent element properties and operation properties.

To solve the above problems, the present invention includes the following items.

[1] A field effect transistor comprising:

a semiconductor layer protruding from a substrate plane, a gate structure body comprising a gate electrode extending from one side surface through a top surface to the other side surface of the semiconductor layer such that it strides over the semiconductor layer, in the side of the semiconductor layer, an insulating film formed between the semiconductor layer and the gate electrode, and a source/drain region formed on both sides sandwiching the gate electrode in the semiconductor layer, wherein channel regions are formed at least in both side surfaces of the semiconductor layer, wherein the gate structure body comprises an eaves structure which is formed based on that a protrusion which projects in the side of the source and drain region in a channel length direction and which has a channel length direction width larger than the part adjacent to the insulating film in the gate electrode, and which extends at least over the top surface of the semiconductor layer in a gate electrode extending direction.

[2] The field effect transistor as described in [1], comprises the eaves structure which is formed based on that the protrusion extends over the whole length in the gate electrode extending direction.

[3] The field effect transistor as described in [1] or [2], wherein the gate structure body comprises a part, on the top surface of the semiconductor layer, where the channel length direction width reduces stepwise along a normal line direction of the top surface towards the semiconductor layer side.

[4] The field effect transistor as described in [3], wherein the gate structure body further comprises a part, on the side surface of the semiconductor layer, where the channel length direction width reduces stepwise along a normal line direction of the side surface towards the semiconductor layer side.

[5] The field effect transistor as described in any of [1] to [4], wherein the gate structure body consists of a plurality of layers having mutually different channel length direction widths.

[6] The field effect transistor as described in [5], wherein the gate structure body comprises a layer containing $SiO_2$ or an Si—N compound as a top layer in the side opposite to the semiconductor layer side.

[7] The field effect transistor as described in any of [1] to [6], wherein the gate structure body comprises a layer containing Mo, W, Ta, Ti, Hf, Re, Ru, Al, Cu or an alloy containing one or more of these metal elements.

[8] The field effect transistor as described in any of [1] to [7], wherein the gate structure body comprises a layer containing an Ni—Si compound, Co—Si compound, Ti—Si compound, W—Si compound, Ta—Si compound, Pt—Si compound or Er—Si compound.

[9] The field effect transistor as described in any of [1] to [8], wherein the gate structure body comprises a layer containing Si, Ge or SiGe.

[10] The field effect transistor as described in any of [1] to [9], wherein the gate structure body comprises a layer containing TiN, TaN, HfN or WN.

[11] The field effect transistor as described in [1], wherein the gate structure body comprises an upper gate electrode extending such that it strides over the semiconductor layer, and a side surface gate electrode formed between the upper gate electrode and the insulating film formed on both side surfaces of the semiconductor layer, and the upper gate electrode comprises the eaves structure is formed based on that the protrusion extends from one side surface gate electrode through the top surface of the semiconductor layer to the other side surface gate electrode such that it strides over the semiconductor layer.

[12] The field effect transistor as described in [1] or [2], wherein the gate structure body has channel length direction widths which continuously decrease in the semiconductor layer side along normal line directions of the top and side surfaces over the top surface and the side surface of the semiconductor layer.

[13] The field effect transistor as described in any of [1] to [12], wherein the largest channel length direction width in the protrusion is more than and up to five times as large as a channel length direction width in a part adjacent to the insulating film in the gate electrode.

[14] The field effect transistor as described in any of [1] to [13], wherein the largest channel length direction width in the protrusion is larger by 6 to 60 nm than a channel length direction width in a part adjacent to the insulating film in the gate electrode.

[15] The field effect transistor as described in any of [1] to [14], comprising a plurality of semiconductor layers having mutually parallel channel length directions, and the single gate electrode formed such that it strides over the plurality of semiconductor layers.

[16] A semiconductor device comprising the first field effect transistor and the second field effect transistor as described in any of [1] to [15], wherein the first field effect transistor has a larger difference "b-a" between the largest channel length direction width "b" of the protrusion and the channel length direction width "a" of the part adjacent to the insulating film in the gate electrode than that in the second field effect transistor.

[17] The semiconductor device as described in [16], wherein the first field effect transistor is a p-type field effect transistor, and the second field effect transistor is an n-type field effect transistor.

[18] A process for manufacturing a field effect transistor, comprising the steps of:

(a) forming a semiconductor layer protruding from a substrate plane, forming an insulating film on the semiconductor layer, and then laminating a gate structure body material over the whole surface, (b) processing the gate structure body material to form a gate structure body comprising a gate electrode extending from one side surface through the top surface to the other side surface of the semiconductor layer such that it strides over the semiconductor layer, in the semiconductor layer side, wherein during forming the gate structure body, forming an eaves structure which is made up based on that a protrusion which projects in the source and drain region side in a channel length direction and which has a larger channel length direction width than that of a part adjacent to the insulating film in the gate electrode, and which extends at least over the top surface of the semiconductor layer in a gate electrode extending direction, and (c) ion-implanting a dopant into the semiconductor layer using the gate structure body as a mask to form a source/drain region.

[19] The process for manufacturing a field effect transistor as described in [18], wherein the ion implantation in the step (c) is conducted in a direction perpendicular to the channel length direction and oblique to a normal line direction of the substrate.

[20] The process for manufacturing a field effect transistor as described in [18] or [19], wherein in the step (b), the eaves structure is made up based on that the protrusion extends over the whole length of the gate electrode extending direction, is formed.

[21] The process for manufacturing a field effect transistor as described in any of [18] to [20], wherein in the step (a), the gate structure body material consisting of a plurality of layers is laminated as the gate structure body material, and the step (b) comprises the steps of:

(d) anisotropically etching the layer not adjacent to the insulating film among the plurality of layers, and (e) etching the layer adjacent to the insulating film among the plurality of layers at least in the normal line direction and the channel length direction of the substrate, using the layer anisotropically etched as a mask.

[22] The process for manufacturing a field effect transistor as described in any of [18] to [20], wherein in the step (a), the gate structure body material consisting of a plurality of layers is laminated as the gate structure body material, and the step (b) is a step etching the plurality of layers at least in the normal line direction and channel length direction of the substrate, where the etching is conducted under the conditions such that the layer adjacent to the insulating film among the plurality of layers are etched at the highest etching rate in the channel length direction.

[23] The process for manufacturing a field effect transistor as described in [22], wherein the etching is isotropic etching.

[24] The process for manufacturing a field effect transistor as described in [23], wherein the isotropic etching is conducted such that etching rates for the individual layers constituting the plurality of layers sequentially increase toward the substrate side along the normal line of the substrate.

[25] The process for manufacturing a field effect transistor as described in any of [21] to [24], wherein in the step (a), the gate structure body material is laminated such that the top layer opposite to the semiconductor layer side becomes a layer containing $SiO_2$ or an Si—N compound.

[26] The process for manufacturing a field effect transistor as described in any of [18] to [25], wherein in the step (a), the gate structure body material comprising a layer containing Mo, W, Ta, Ti, Hf, Re, Ru, Al, Cu or an alloy containing one or more of these metal elements is laminated.

[27] The process for manufacturing a field effect transistor as described in any of [18] to [26], wherein in the step (a), the gate structure body material comprising a layer containing an Ni—Si compound, Co—Si compound, Ti—Si compound, W—Si compound, Ta—Si compound, Pt—Si compound or Er—Si compound is laminated.

[28] The process for manufacturing the field effect transistor as described in any of [18] to [27], wherein in the step (a), a gate structure body material comprising a layer containing Si, Ge or SiGe is laminated.

[29] The process for manufacturing the field effect transistor as described in any of [18] to [28], wherein in the step (a), a gate structure body material comprising a layer comprising TiN, TaN, HfN or WN is laminated.

[30] The process for manufacturing a field effect transistor as described in [18] or [19], wherein in the step (a), the laminating the gate structure body material over the whole surface comprises the step of laminating a side surface gate electrode material over the whole surface, etching back the side surface gate electrode material to form a side surface gate electrode on the insulating film formed on both side surfaces of the semiconductor layer, and then laminating an upper gate electrode material over the whole surface, and in the step (b), the upper gate electrode material is processed to form an upper gate electrode comprising the protrusion which strides over the semiconductor layer from one side surface gate electrode through the top surface of the semiconductor layer to the other side surface gate electrode, as the gate electrode.

[31] The process for manufacturing a field effect transistor as described in any of [18] to [30],
wherein in the step (b), the protrusion is formed such that the largest channel length direction width in the protrusion is more than and up to five times as large as a channel length direction width in a part adjacent to the insulating film in the gate electrode.

[32] The process for manufacturing a field effect transistor as described in any of [18] to [31],
wherein in the step (b), the protrusion is formed such that the largest channel length direction width in the protrusion is larger by 6 to 60 nm than a channel length direction width in a part adjacent to the insulating film in the gate electrode.

[33] The process for manufacturing a field effect transistor as described in any of [18] to [32],
wherein in the step (a), a plurality of semiconductor layers are formed such that their channel length directions are mutually parallel,
in the step (b), the single gate electrode is formed such that it strides over the plurality of semiconductor layers.

[34] The process for manufacturing a field effect transistor as described in [18] or [19],
wherein in the step (b), the gate structure body is formed such that the gate structure body has channel length direction widths over the top surface and the side surface of the semiconductor layer which continuously decrease in the semiconductor layer side along normal line directions of the top and side surfaces, respectively.

[35] A process for manufacturing a semiconductor device comprising a first and a second field effect transistors,
wherein a first semiconductor layer comprising a first gate structure body and a second semiconductor layer comprising a second gate structure body are formed by steps (a) and (b) as described in any of [18] to [34], further comprising the steps of:
(f) at least one of the first gate structure body and the second gate structure body is etched such that the first gate structure body has a larger difference "b-a" between the largest channel length direction width "b" of the protrusion and a channel length direction width "a" of a part adjacent to the insulating film in the gate electrode than the second gate structure body,
(g) ion-implanting the first semiconductor layer with a dopant using the first gate structure body as a mask to form a source/drain region and thus to manufacture the first field effect transistor, and
(h) ion-implanting the second semiconductor layer with a dopant using the second gate structure body as a mask to form a source/drain region and thus to manufacture the second field effect transistor.

[36] The process for manufacturing a semiconductor device as described in [35],
wherein the step (f) is a step of forming a mask over the second gate structure body and the second semiconductor layer and etching at least a part adjacent to the insulating film in the gate electrode in the first gate structure body in the channel length direction.

[37] The process for manufacturing a semiconductor device as described in [35] or [36],
wherein in the step (g), a p-type field effect transistor is formed as the first field effect transistor, and
in the step (h), an n-type field effect transistor is formed as the second field effect transistor.

Forming a gate structure body comprising an eaves structure allows for preventing a substrate from being damaged, and for ensuring a constant distance between source/drain regions without forming a gate side wall to achieve a uniform dopant concentration within a semiconductor layer. Consequently, a FinFET having excellent element properties and operation properties can be provided.

BRIEF DESCRIPTION OF THE DRAWINGS

FIG. 12 shows a FinFET of the present invention.
FIG. 15 shows a process for manufacturing a FinFET of the present invention.

DETAILED DESCRIPTION OF THE INVENTION

Figure 1:
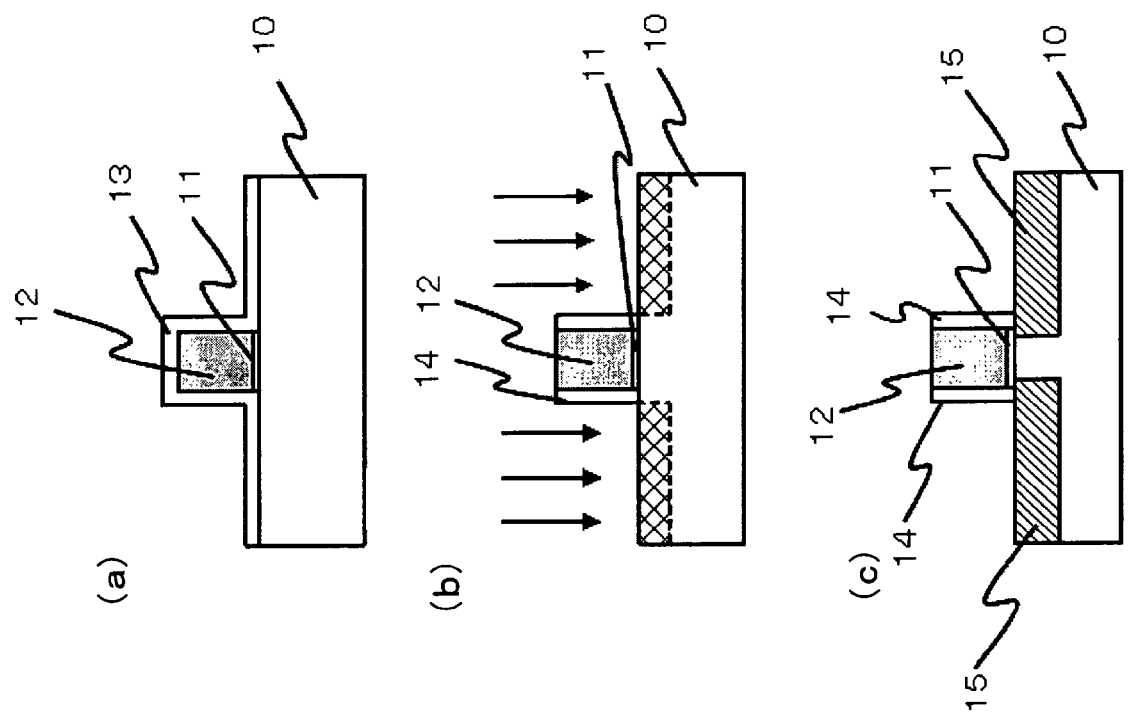
FIG. 1 shows a conventional process for manufacturing a planar MOSFET.
Figure 2:
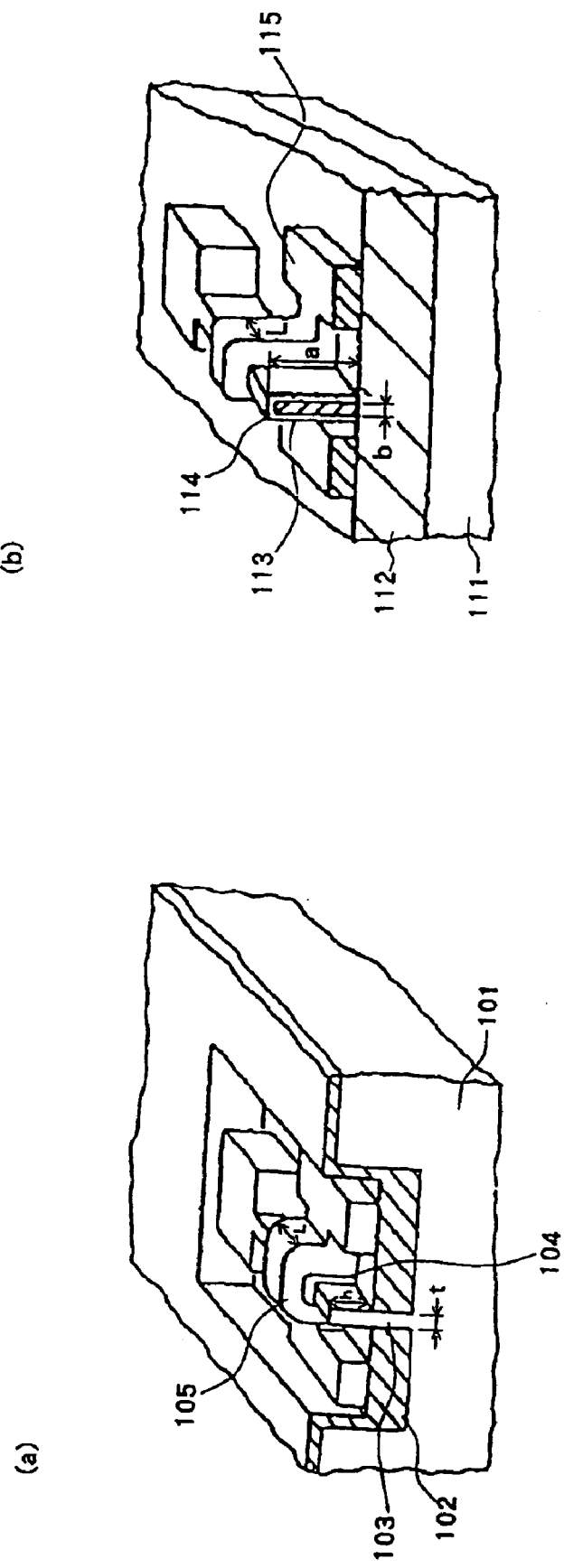
FIG. 2 shows a conventional FinFET.
Figure 3:
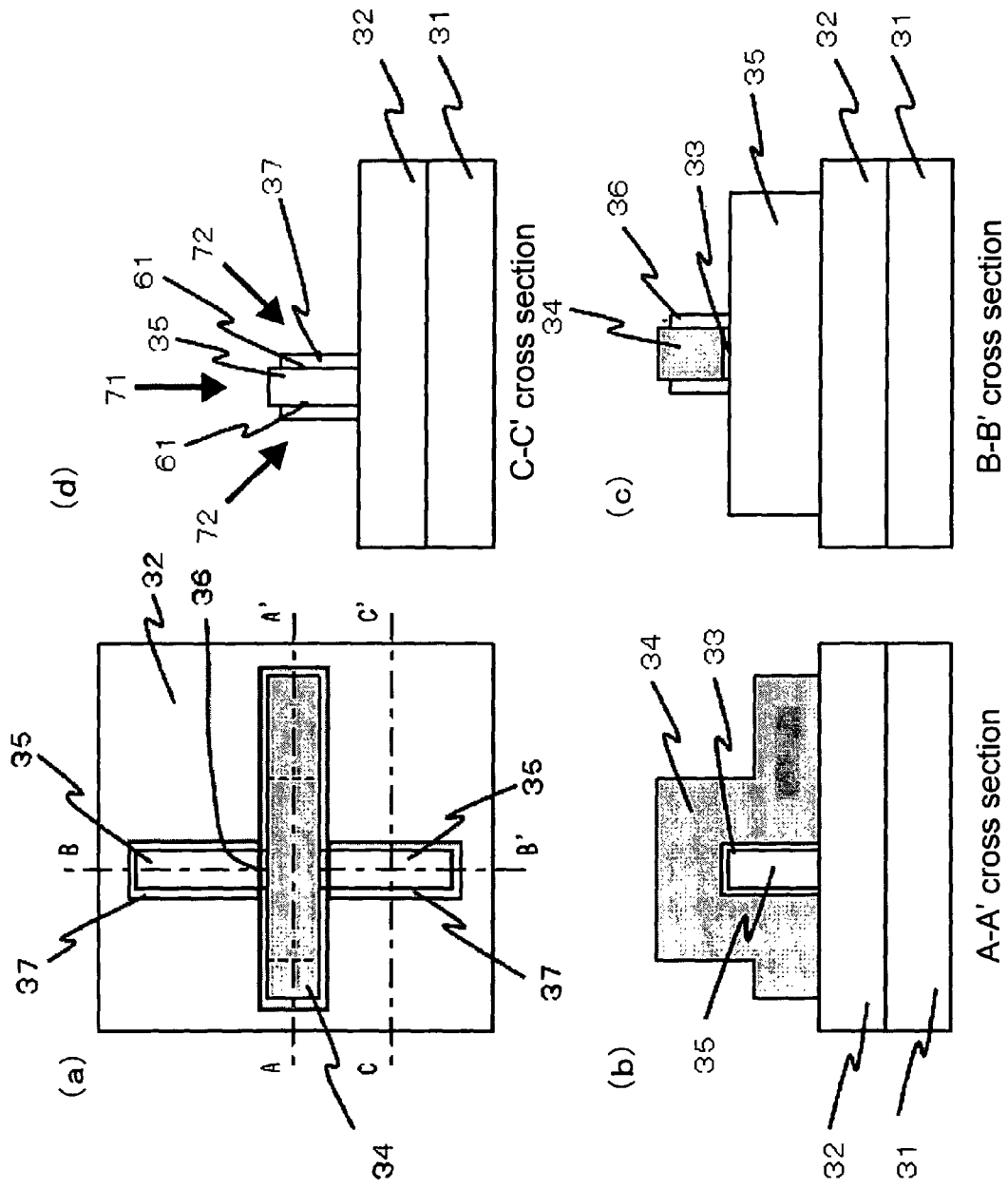
FIG. 3 shows a conventional process for manufacturing a FinFET.

FinFET of the Present Invention
A FinFET of the present invention comprises an eaves structure at least in a part of a gate structure body. The eaves structure is formed by extending a protrusion projecting to the source and drain region side in a channel length direction and having a width larger than a channel length direction width in a part adjacent to an insulating film in a gate electrode (gate insulating film), at least over the top surface of the semiconductor layer in a gate electrode extending direction.
By thus forming the eaves structure in the gate structure body, a dopant is not ion-implanted into the semiconductor layer under the protrusion during dopant ion-implantation (ion implantation from a normal line direction of the substrate, ion implantation from a direction perpendicular to a channel length direction and oblique to the normal line direction of the substrate), so that a desired distance between source/drain regions can be achieved. Furthermore, since a gate side wall is not formed, damage of the substrate and generation of a residual film in a side surface of semiconductor layer can be prevented. Therefore, when conducting ion implantation of a dopant in a direction oblique to a normal line of the substrate, the dopant can be uniformly implanted within the semiconductor layer. Consequently, FinFET having excellent element properties and operation properties can be obtained.

A gate structure body of a FinFET according to the present invention comprises a gate electrode extending from one side surface of the semiconductor layer through the top surface to the other side surface such that it strides over the semiconductor layer. The gate structure body consists of this gate electrode or further comprises a gate cap insulating film on at least a part of the gate electrode. That is, the gate structure body may consist of the gate electrode alone or the gate electrode and the gate gap insulating film. Here, the gate electrode is formed in the semiconductor layer side in the gate structure body such that it is in contact with the gate insulating film.

An "eaves structure" refers to a part formed in a boundary between a part in a gate electrode adjacent to an insulating film (a gate insulating film) having a channel length direction width "a" or a part in the gate structure body having an equivalent width "a" and a part having a width larger than the width "a". In other words, an eaves structure may be present in a gate electrode, in a gate cap insulating film, or in a boundary between these.

Specific dimensions of a FinFET according to the present invention can be appropriately selected within, for example, the following ranges.

Width in a direction perpendicular to a channel length direction of a semiconductor layer: 5 to 100 nm, Channel length direction width of a semiconductor layer: three to ten as large as a channel length direction width of a part adjacent to an insulating film in a gate electrode (per a transistor), Height of a semiconductor layer: 10 to 200 nm, Thickness of a gate insulating film: 1 to 5 nm (for $SiO_2$), Dopant concentration in a channel region: 0 to $1 \times 10^{19}$ $cm^{-3}$, Dopant concentration in a source/drain region: $1 \times 10^{19}$ to $1 \times 10^{21}$ $cm^{-3}$.

A height of the semiconductor layer is a length in a vertical direction to a substrate plane in a semiconductor part projecting from a base insulating film plane. A semiconductor layer has a top surface and both side surfaces, and typically the semiconductor layer has a substantially cuboid shape.

A part of the protrusion projecting in the source and drain region side in a channel length direction in comparison with its part adjacent to an insulating film in a gate electrode has preferably a width at least ⅓ and less than equivalence of a distance of dopant expansion in the channel length direction during ion implantation for forming a source/drain region and during thermal diffusion.

A channel length direction width of the protrusion is larger than a width of a part adjacent to the insulating film in the gate electrode preferably by 6 to 60 nm, more preferably by 10 to 40 nm, further preferably by 25 to 35 nm. Furthermore, the largest channel length direction width of the protrusion is preferably up to 5 times, more preferably 2 to 4 times, further preferably 3 to 4 times as large as a channel length direction width of a part adjacent to the insulating film in the gate electrode.

A protrusion width within such a range allows for a desired appropriate distance between source/drain regions even when a dopant diffuses in a channel length direction during dopant ion implantation and during thermal diffusion, and furthermore, for preventing an excessive offset.

There will be described a variety of embodiments of FinFET according to the present invention.

Embodiment 1

A first embodiment of the present invention relates to a FinFET in which a channel length direction width of a gate structure body varies stepwise. The phrase, "a channel length direction width varies stepwise", means that a gate structure body consists of two or more layers and adjacent layers have different channel length direction width, or that a gate structure body consists of a single layer gate electrode which comprises a part with a channel length direction width varying intermittently (discontinuously).

Figure 4:
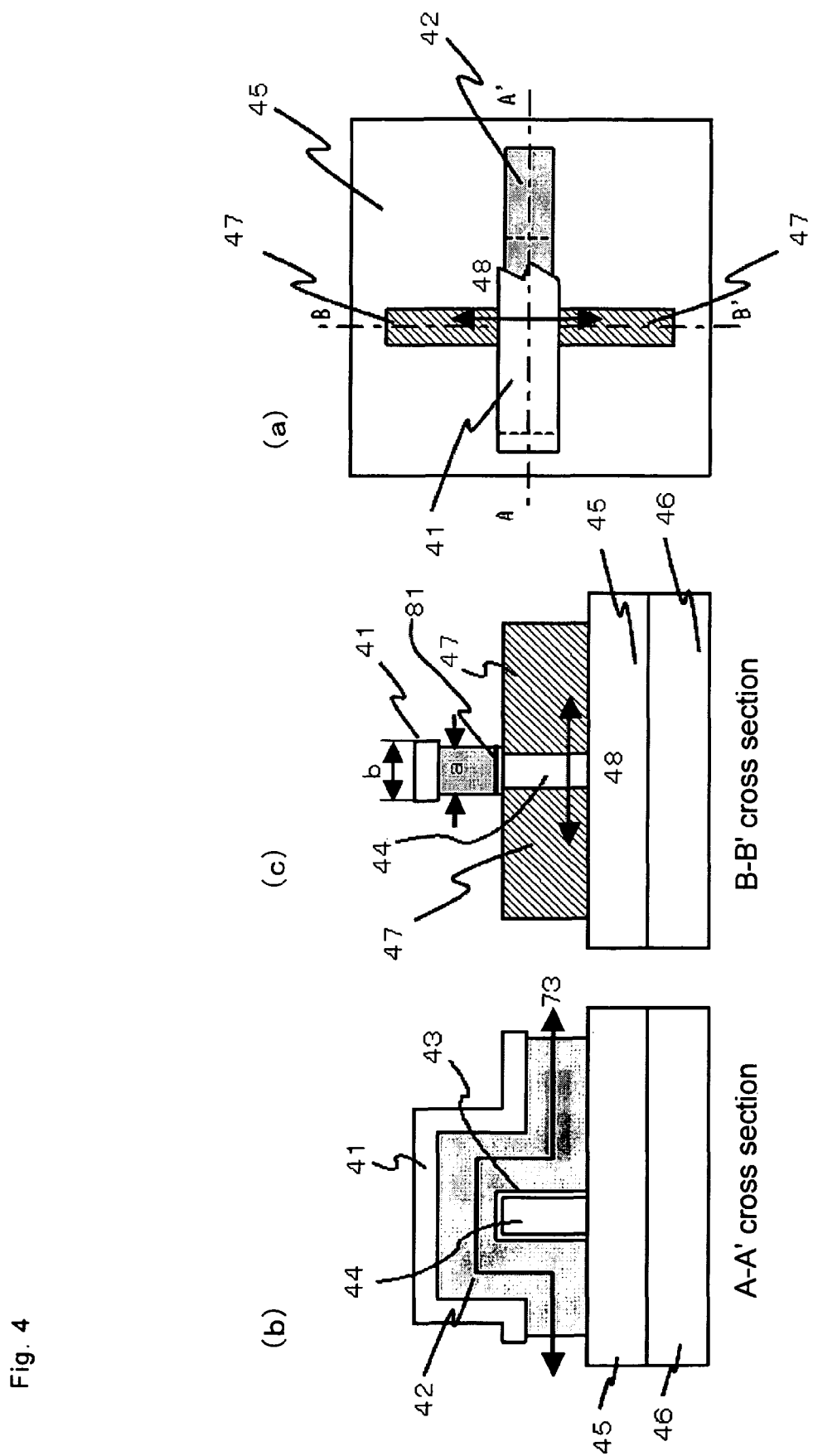
FIG. 4 shows a FinFET of the present invention.
Figure 5:
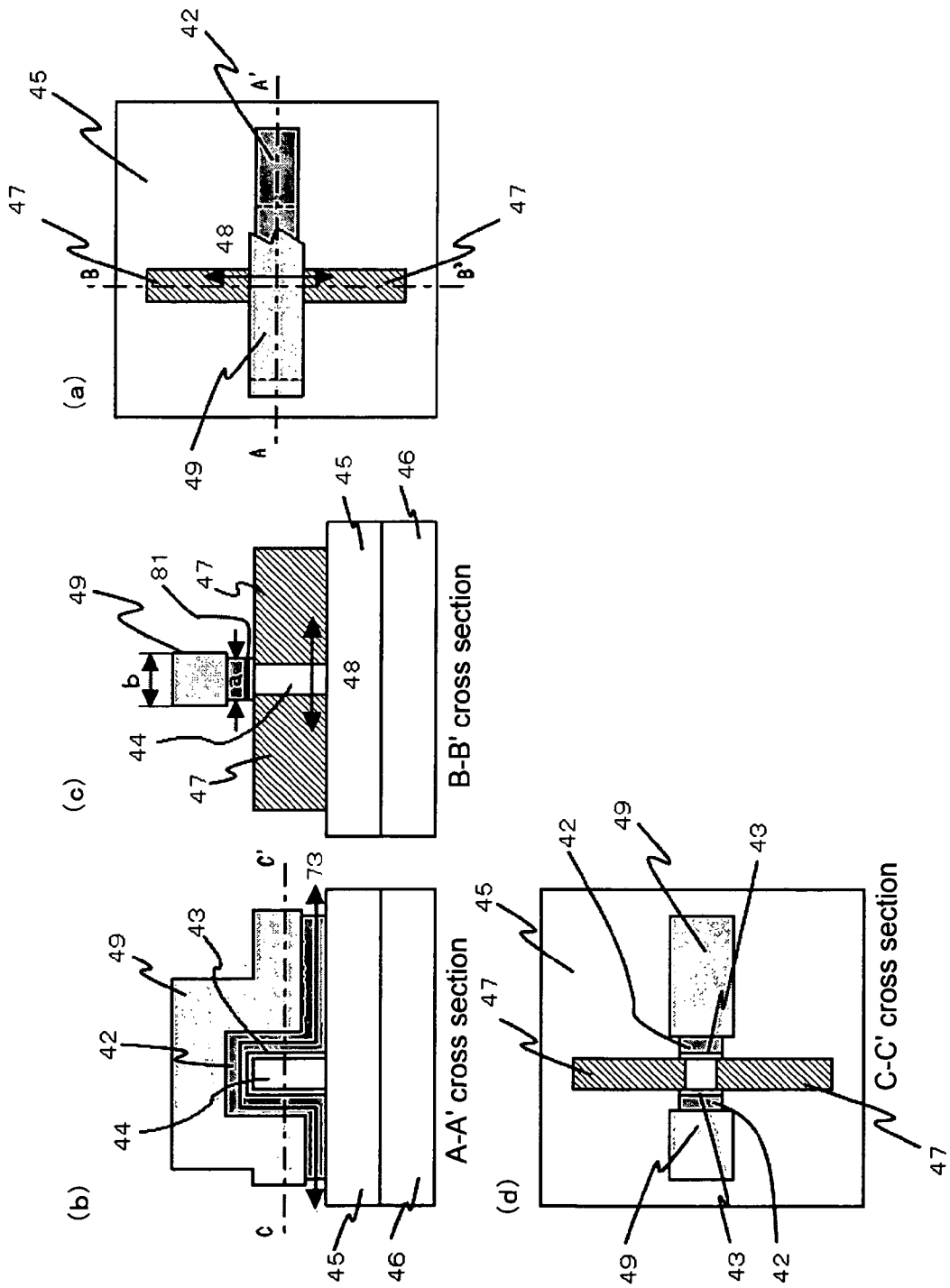
FIG. 5 shows a FinFET of the present invention.
Figure 6:
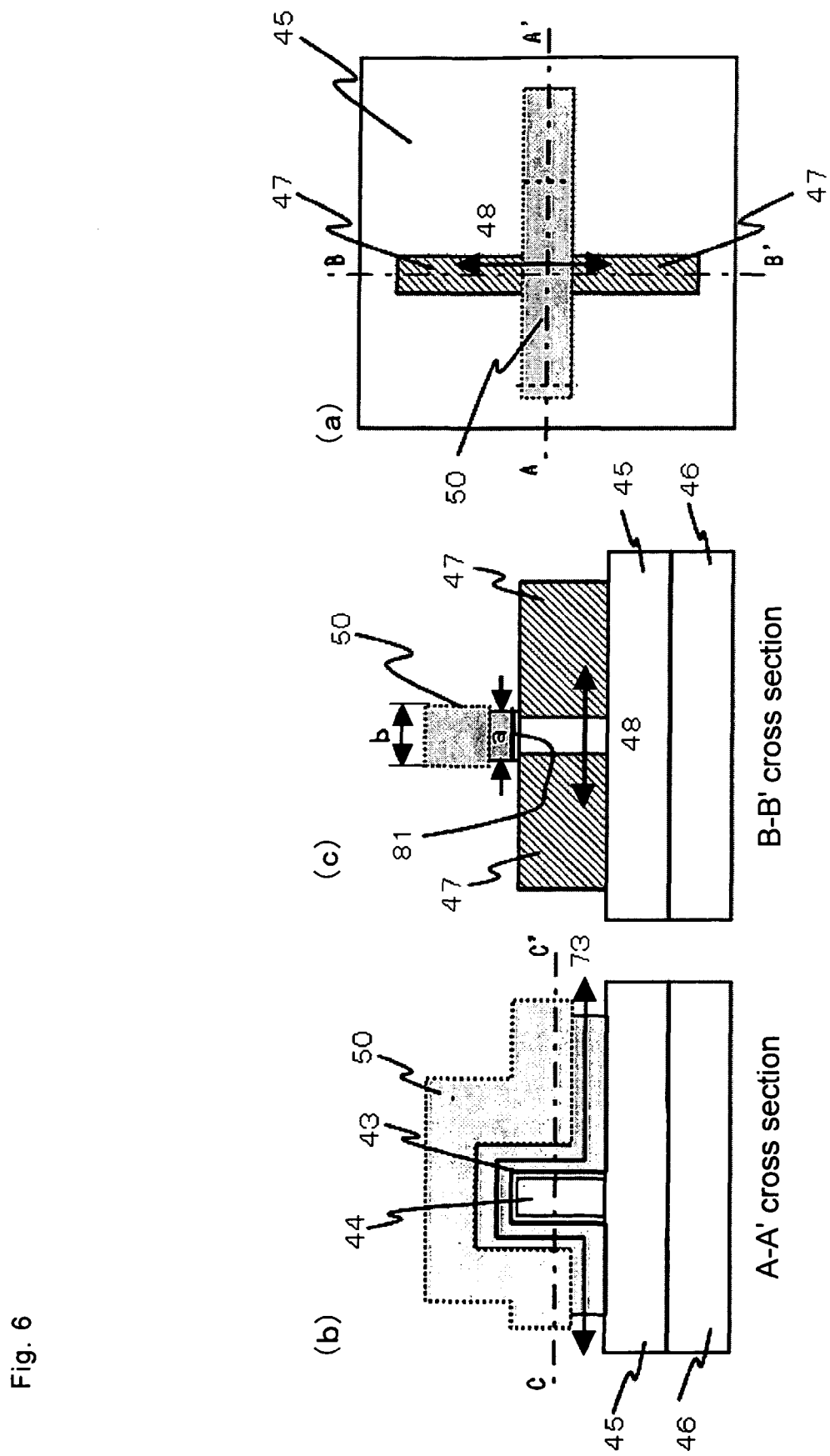
FIG. 6 shows a FinFET of the present invention.

FIGS. 4 to 6 show some examples of such a FinFET. FIG. 4(*a*) is a plan view of a FinFET, FIG. 4(*b*) is an A-A' cross-sectional view of a FinFET in FIG. 4(*a*), and FIG. 4(*c*) is a B-B' cross-sectional view. FIG. 5(*a*) is a plan view of a FinFET, FIG. 5(*b*) is an A-A' cross-sectional view of a FinFET in FIG. 5(*a*), FIG. 5(*c*) is a B-B' cross-sectional view and FIG. 5(*d*) is a C-C' cross-sectional view. FIG. 6(*a*) is a plan view of a FinFET, FIG. 6(*b*) is an A-A' cross-sectional view of a FinFET in FIG. 6(*a*), and FIG. 6(*c*) is a B-B' cross-sectional view. Any of these FinFETs is formed using an SOI substrate, and a tri-gate type FinFET where a channel region is formed in the top surface and the side surface in the semiconductor layer, is shown.

FIG. 4 shows a FinFET where a gate structure body consists of two layers, that is, a gate cap insulating film 41 and a lower gate electrode 42.

In this FinFET, a channel length direction is indicated by an arrow 48. This channel length direction is a direction in which a channel current flows between source/drain regions and is parallel to the substrate. The lower gate electrode 42 extends from one side surface of the semiconductor layer through the top surface of the semiconductor layer 44 to the other side surface such that it strides over the semiconductor layer. An extension direction of this lower gate electrode is indicated by an arrow 73, and is perpendicular to a channel length direction.

In this FinFET, a part adjacent to an insulating film in a gate electrode means a part of a gate electrode directly contiguous to a gate insulating film, which is indicated by 81 (a part indicated by a bold line) in this figure. Its width in a channel length direction 48 is indicated by "a" in the figure. A protrusion means a part projecting in a direction toward the source and drain region side in the channel length direction 48 (a direction from the gate structure body toward the source region in the channel length direction and a direction from the gate structure body toward the drain region) in comparison with the part 81 adjacent to the insulating film and having a width larger than the width "a", and FIG. 4(*c*) shows that in this FinFET, the gate cap insulating film 41 comprises a protrusion. In this FinFET, the gate cap insulating film 41 in which this protrusion extends over the whole length in an extension direction 73 of the lower gate electrode 42 forms an eaves structure (there is an eaves structure over the whole gate electrode in the extension direction 73: an eaves structure is formed in a boundary between a lower gate electrode 42 and a gate cap insulating film 41).

This width "b" may be constant or vary along the extension direction 73 of the gate electrode.

The lower gate electrode may be a low-resistance layer comprising Mo, W, Ta, Ti, Hf, Re, Ru, Al, Cu or an alloy containing at least one of these metal elements (comprising at least one of metal elements selected from the group consisting of Mo, W, Ta, Ti, Hf, Re, Ru, Al and Cu); a low-resistance layer (silicide layer) comprising an Ni—Si compound, Co—Si compound, Ti—Si compound, W—Si compound, Ta—Si compound, Pt—Si compound or Er—Si compound; or a layer comprising Si, Ge, SiGe, TiN, TaN, HfN or WN. A material constituting a gate cap insulating film is preferably $SiO_2$ or an Si—N compound (for example, $Si_3N_4$).

In the FinFET in FIG. 4, the lower gate electrode has a smaller channel length direction width than that of the gate cap insulating film, so that in comparison with a case where the overall gate structure body has the same channel length direction width as the gate cap insulating film, a parasitic capacity in the overall gate structure body can be reduced.

The FinFET in FIG. 5 is different from the FinFET in FIG. 4 in that a gate structure body consists of a two-layer gate electrode. In this FinFET, a channel length direction is indicated by an arrow 48, and a gate electrode extension direction is indicated by an arrow 73.

The lower gate electrode 42 and the upper gate electrode 49 may be a low-resistance layer comprising Mo, W, Ta, Ti, Hf, Re, Ru, Al, Cu or an alloy containing one or more of these metal elements (comprising at least one of metal elements selected from the group consisting of Mo, W, Ta, Ti, Hf, Re, Ru, Al and Cu). Alternatively, it may be a low-resistance layer (silicide layer) comprising an Ni—Si compound, Co—Si compound, Ti—Si compound, W—Si compound, Ta—Si compound, Pt—Si compound or Er—Si compound, or a layer comprising Si, Ge, SiGe, TiN, TaN, HfN or WN. The silicide layer may be, for example, made of NiSi, $CoSi_2$, $TiSi_2$, $WSi_2$, $TaSi_2$, PtSi or $ErSi_2$. In addition, the nickel silicide (Ni—Si compound) may be $NiSi_2$, $Ni_3Si$ or a compound having an intermediate composition between them. Furthermore, the lower gate electrode is made of a material different from that of the upper gate electrode.

In this FinFET, the part in the gate electrode adjacent to the insulating film 43 is 81 (a part indicated by a bold line), and its width in a channel length direction 48 is indicated by "a". The protrusion is a part projecting in the source and drain region side in the channel length direction 48 in comparison with the part 81 adjacent to the insulating film and having a width "b" larger than the width "a" of the part 81 adjacent to the insulating film, and FIG. 5(*c*) shows that in this FinFET, the upper gate electrode 49 comprises a protrusion. In this FinFET, the upper gate electrode 49 in which this protrusion extends over the whole length in a gate electrode extending direction 73, forms an eaves structure (an eaves structure is formed in a boundary between the upper gate electrode 49 and the lower gate electrode 42).

In this FinFET, the upper gate electrode has a large channel length direction width, so that gate contact can be facilitated and freedom in device design can be increased. Since the lower gate electrode has a smaller channel length direction width than the upper gate electrode, a parasitic capacity in the overall gate electrode can be reduced in comparison with a case where the overall gate electrode has the same channel length direction width as the upper gate electrode. Furthermore, by using a highly conductive material such as a metal for the upper gate electrode 49 and the lower gate electrode 42, a resistance of the gate electrode can be reduced while keeping a channel length direction width constant in the part adjacent to the insulating film in the gate electrode in comparison with a case where the upper gate electrode 49 has the same channel length direction width as the lower gate electrode 42.

The FinFET in FIG. 6 is different from the FinFETs in FIGS. 4 and 5 in that a gate structure body is a single layer gate electrode, but a part adjacent to an insulating film in a gate electrode, a protrusion and an eaves structure can be determined in accordance with the criteria as in FIGS. 4 and 5. Specifically, a part adjacent to an insulating film in a gate electrode is 81 in the figure (the part indicated by a bold line), and its width in the channel length direction 48 is indicated by "a". The gate structure body comprises a protrusion projecting in the source and drain region side of the channel length direction 48 in comparison with a part 81 adjacent to the insulating film and having a width "b" larger than the width "a" of the part 81 adjacent to the insulating film. FIG. 6(*c*) shows that in this FinFET, the part 50 (the part surrounded by a dotted line) comprises a protrusion. Furthermore, as shown in FIG. 6(*b*), this protrusion extends over the whole length in the gate electrode extension direction 73, and an eaves structure is formed under the part 50. Thus, a gate structure body consisting of a single layer can prevent transistor performance from being deteriorated due to a parasitic capacity and a parasitic resistance generated between a plurality of layers.

As shown in FIGS. 4 to 6, the protrusion has a width in the channel length direction 48 larger than the width "a" of the part adjacent to the insulating film in the gate electrode. As shown in these cross-sectional views, the ends of the source and drain region side in the channel length direction of this protrusion must be more projecting to the source and drain region side (both sides) than the ends in the channel length direction of the part adjacent to the insulating film in the gate electrode. In terms of a degree of projection to the ends of this protrusion in comparison with the part adjacent to the insulating film, a projecting degree of the protrusion may be the same or different for the source region side and the drain region side. However, since a semiconductor layer in which the source and the drain regions are to be formed must be under the same implantation conditions during dopant ion implantation, a projecting degree of the protrusion is preferably equal for both sides.

In an eaves structure of the FinFETs in FIGS. 4 to 6, the protrusion extends over the whole length in the gate electrode extending direction 73. Thus, ion implantation of a dopant into the semiconductor layer under the eaves structure can be practically completely prevented when conducting dopant ion implantation not only in the normal line direction of the substrate but also in a direction oblique to the normal line direction of the substrate.

Figure 21:
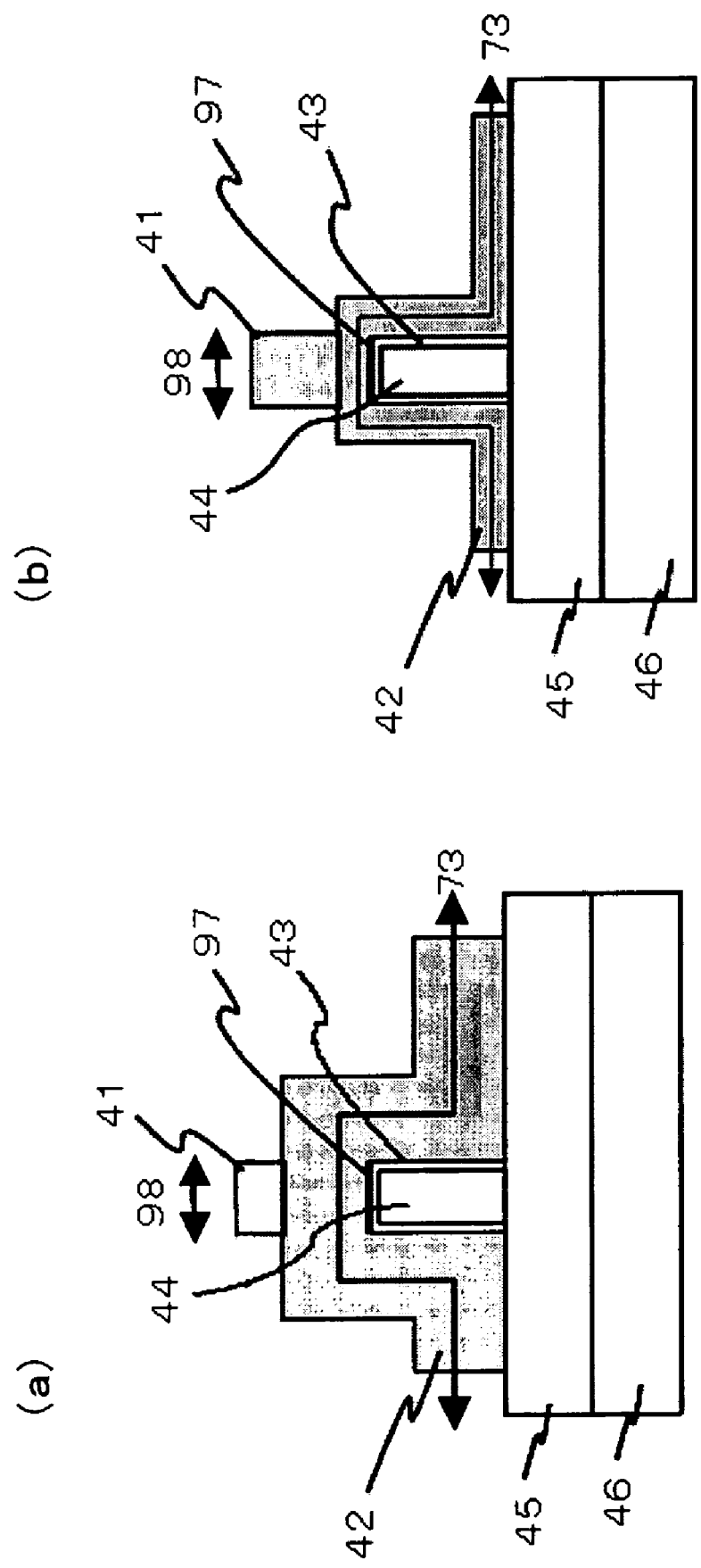
FIG. 21 shows a FinFET of the present invention.

In the FinFET of the present invention, the protrusion does not necessarily have to extend over the whole length in the gate electrode extension direction, but an eaves structure which is made up based on that at least the protrusion extends over the top surface of the semiconductor layer in the gate electrode extending direction, which may be acceptable. As shown in FIG. 21(*a*) (corresponding to the cross-sectional view of FIG. 4(*b*)) and (b) (corresponding to the cross-sectional view of FIG. 5(*b*)), in FIGS. 21(*a*) and (*b*), the top surface of the semiconductor layer corresponds to 97 (bold line), and the eaves structure may be formed at least on this part. The phrase, "over the top surface of a semiconductor layer in a gate electrode extending direction" relates to a part on the top surface of the semiconductor layer in the gate electrode extending direction 73, which is indicated by the arrow 98 in the Figures.

When an eaves structure is only present on the top surface of a semiconductor, ion implantation into a semiconductor layer under the eaves structure can be prevented during ion implantation from a normal line direction of the substrate. Furthermore, a protrusion further extending from the top surface of the semiconductor layer toward the ends in the gate electrode extension direction can prevent ion implantation into the semiconductor layer under the eaves structure during ion implantation from a direction oblique to the normal line direction of the substrate. A degree of projection in this protrusion from the top surface of the semiconductor layer toward the ends in the gate electrode extension direction may be appropriately selected, depending on an angle of oblique ion implantation.

The gate structure body may be a polysilicon film or a plurality of polysilicon films having different dopant concentrations. Thus, when the gate structure body material consists of a plurality of polysilicon films having different dopant concentrations, an etching rate difference derived from a dopant concentration difference can be utilized to facilitate manufacturing a FinFET comprising an eaves structure. For preventing depletion of the gate electrode, it is preferable that a lower film has a higher dopant concentration in the polysilicon film.

Thus, the gate structure body in the FinFET of the present invention may consist of two layers as shown in FIGS. 4 and 5, or consist of a single layer as shown in FIG. 6. The number of layers constituting the gate structure body is not limited to these, but three or more layers may be used. In such a case, it may be acceptable that at least one layer other than the layer adjacent to the insulating film in the gate electrode has a larger channel length direction width than the width of the layer adjacent to the insulating film, to form a protrusion.

Figure 7:
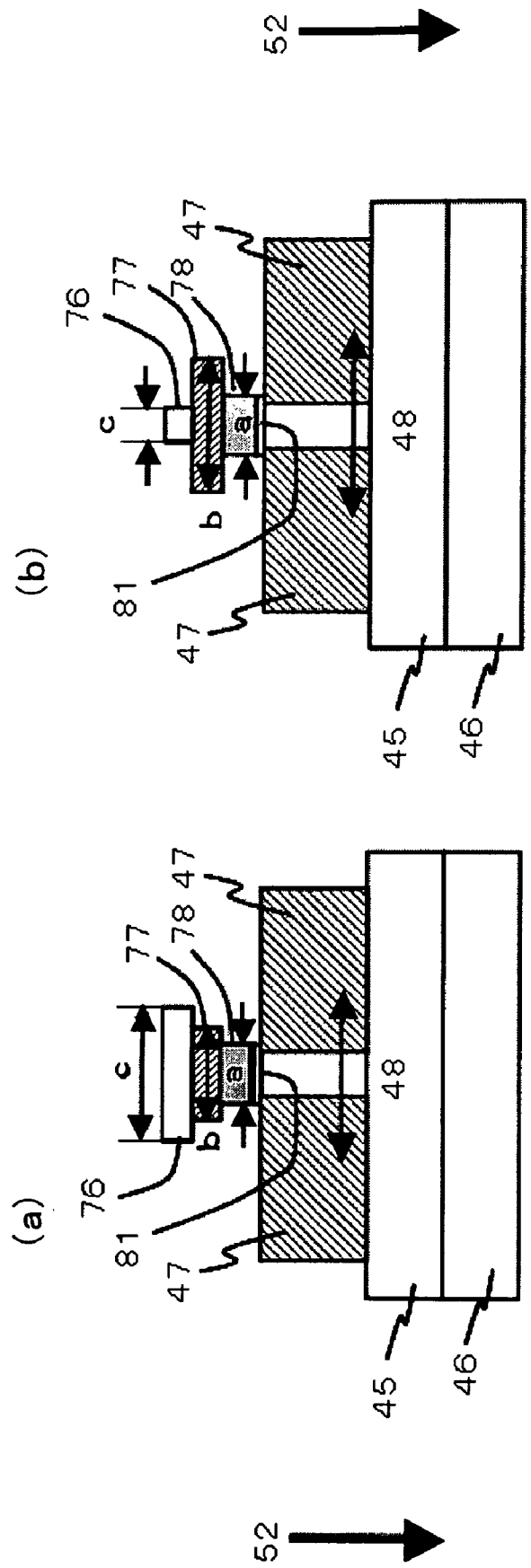
FIG. 7 shows a FinFET of the present invention.

FIG. 7 shows a cross-sectional view parallel to a channel length direction and perpendicular to a substrate for a FinFET in which a gate structure body consists of three layers (corresponding to the cross-sectional view of FIG. 4(c)). In FIG. 7, a direction along the normal line of the substrate toward the substrate is indicated by an arrow 52, and the channel length direction is indicated by an arrow 48.

In the FinFET of FIG. 7(a), a part adjacent to the insulating film 43 is 81, and its width in a channel length direction 48 is indicated by "a" in this figure. The protrusion projects to the source and drain region side in a channel length direction 48 in comparison with the part 81 in FIG. 7(a), and layers 76 and 77 having a width larger than the width "a" comprise a protrusion. In this FinFET, a channel length direction width of each layer reduces stepwise in the direction of the arrow 52 (in the figure, a width "c" of the layer 76>a width "b" of the layer 77>a width "a" of the layer 78). Thus, when a width reduces stepwise, the top layer 76 can have the largest width, allowing gate contact to be further facilitated. Furthermore, even when a width ratio of "a" to "c" is large, a middle layer 77 having an intermediate width "b" can support the layer 76 and thus can prevent the layer 76 from being damaged. In addition, a parasitic resistance can be reduced in comparison with a case where a gate structure body has a width "c" in its whole length.

FIG. 7(b) shows a FinFET in which a gate structure body consists of three layers as shown in FIG. 7(a), except that a relationship for a channel length direction width between the layers is a width "b" of the layer 77>a width "a" of the layer 78>a width "c" of the layer 76. Among these, only the layer 77 projects to the source and drain region side in the channel length direction 48 in comparison with the part 81 adjacent to the insulating film and has a width "b" larger than the width "a", and only the layer 77 comprises a protrusion.

Figure 8:
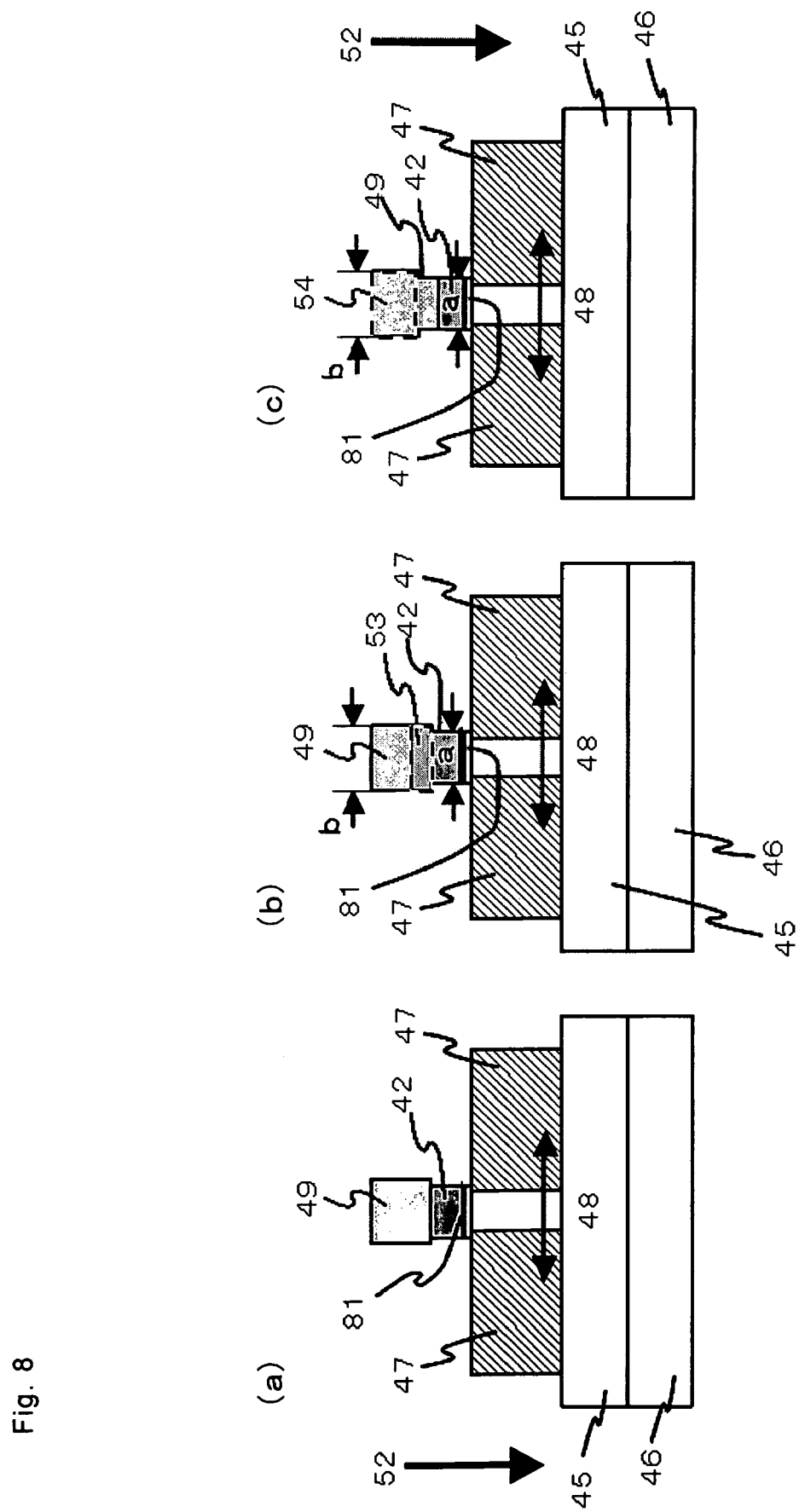
FIG. 8 shows a FinFET of the present invention.

Furthermore, FIGS. 8(b) and (c) show variations of a FinFET of the present invention. FIG. 8 shows a cross section parallel to a channel length direction and perpendicular to its substrate (corresponding to the cross-sectional view of FIG. 4(c)) of a FinFET in which a gate structure body consists of a two-layer gate electrode and. FIG. 8(a) shows a FinFET where the upper gate electrode in the two-layer gate electrode comprises a protrusion to form an eaves structure, which corresponds to the FinFET of FIG. 5. In both FinFETs of FIGS. 8(b) and (c), gate electrodes comprise a two-layer structure, where a channel length direction width varies stepwise in the middle of one layer.

In the FinFET of FIG. 8(b), the lower gate electrode 42 has a channel length direction width which reduces stepwise (discontinuously) in the middle of the direction 52 along the normal line direction of the substrate toward the substrate side. In this FinFET, a part adjacent to an insulating film in a gate electrode corresponds to 81 and the part has a width "a". Furthermore, the upper gate electrode 49 and the upper part 53 of the lower gate electrode (the part surrounded by a dotted line) comprises a protrusion which projects to the source and drain region side in the channel length direction in comparison with the part 81 and has a width "b" larger than the width "a". This part (the upper gate electrode 49 and the upper part 53 of the lower gate electrode 42) extends over the whole length in the gate electrode extension direction to form an eaves structure.

In the FinFET of FIG. 8(c), in the direction of the arrow 52, a channel length direction width becomes stepwise smaller in the middle of the upper gate electrode 49. In this FinFET, a part adjacent to an insulating film in a gate electrode corresponds to 81, and the upper part 54 of the upper gate electrode 49 (the part surrounded by a dotted line) comprises a protrusion having a width "b" larger than the width "a". This part (the upper part 54 of the upper gate electrode 49) extends over the whole length in the gate electrode extension direction to form an eaves structure.

As described above, in a FinFET of the present invention, a gate structure body may consist of a plurality of layers in which a channel length direction width varies stepwise in a normal line direction of a substrate.

Figure 22:
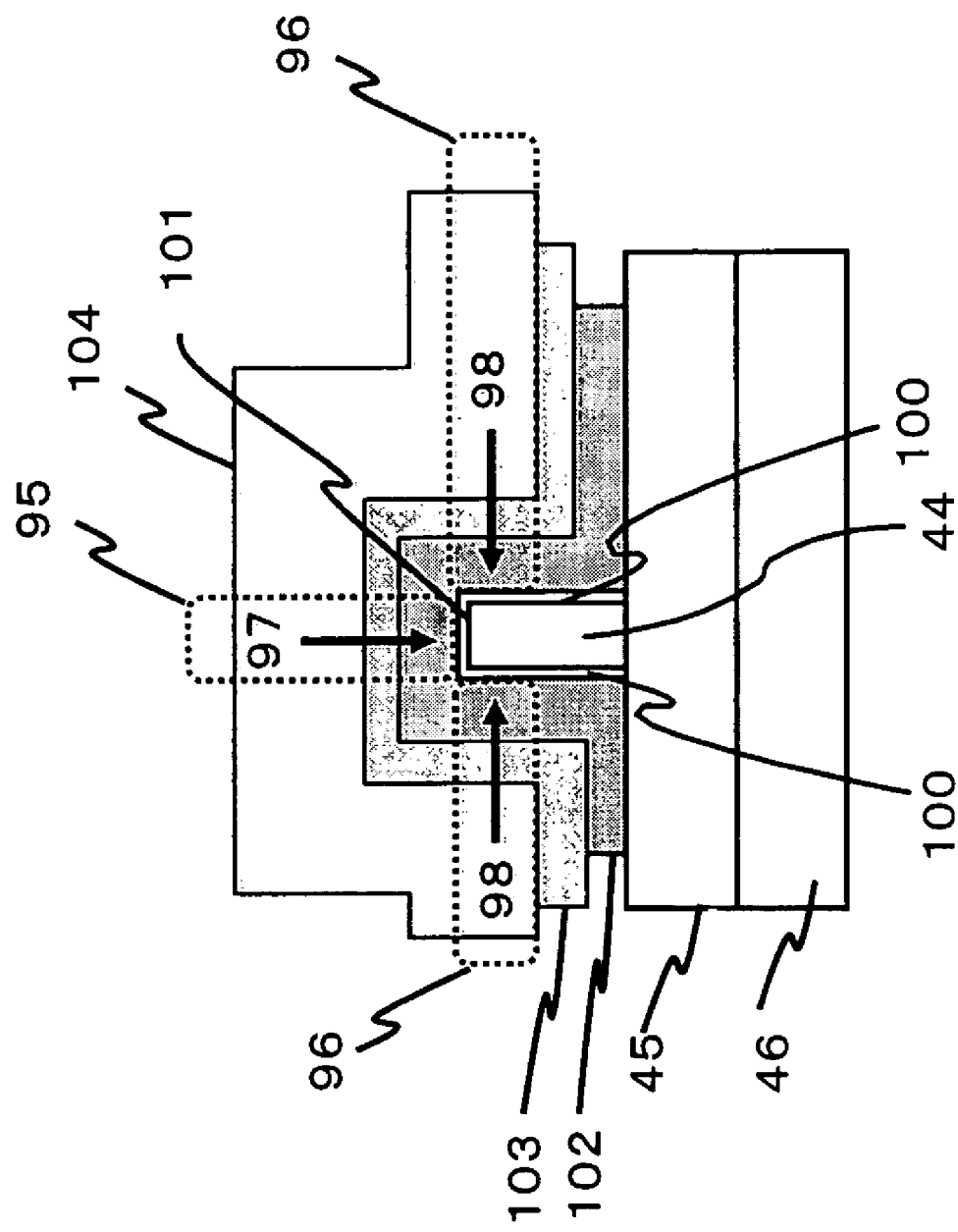
FIG. 22 shows a FinFET of the present invention.
In the drawings, the symbols denote the following meanings; 41 gate cap insulating film, 42: lower gate electrode, 43: gate insulating film, 44: semiconductor layer, 45: insulating film, 46: semiconductor substrate, 47: source/drain region, 48: channel length direction. 49: upper gate electrode, 52: direction toward a substrate along a normal line direction of the substrate, 54: 15 interlayer insulating film, 57: first FinFET, 58: second FinFET, 59: interlayer insulating film. 60: interconnection layer, 62: direction of ion implantation, 64: mask, 73: direction of extension of a gate electrode, 74: semiconductor layers in both sides, 76, 77, 78: layer, 81: part adjacent to an insulating film in a gate electrode, 86: lower gate electrode material, 87: upper gate electrode material, 20 88: gate electrode, 90: upper gate electrode, 91, 92: semiconductor layer.

The gate structure body may comprise a part, on the top surface of the semiconductor layer, where the channel length direction width reduces stepwise along the normal line direction of the top surface of the semiconductor layer toward the semiconductor layer side. Furthermore, there may be formed a gate structure body on the top surface and at least the side surface of the sector part in the semiconductor layer, and there may be a part where the channel length direction width of this gate structure body reduces stepwise toward the semiconductor layer side along the normal line direction of the top surface and the side surface in this semiconductor layer. FIG. 22 shows an example of such a FinFET. In this FinFET, a gate structure body consists of three layers. Then, in the part 95 in the gate structure body on the top surface 101 in the semiconductor layer 41, a channel length direction width varies in the order of layer 104>layer 103>layer 102 along a direction 97 toward the semiconductor layer side in the normal line direction in the top surface of the part 95. Furthermore, in the part 96 in the gate structure body on the side surface 100 in the semiconductor layer 41, a channel length direction width varies in the order of layer 104>layer 103>layer 102 along a direction 98 toward the semiconductor layer side in the normal line direction in the side surface of the part 95.

Here, the stepwise variation in a channel length direction width may occur between different layers or in the middle of a single layer. Furthermore, in a part other than a part adjacent to an insulating film in a gate electrode, its channel length direction width may increase or reduce stepwise along the normal line direction in the top surface and the side surface toward the semiconductor layer side. There are no restrictions to a rate of such a stepwise increase or decrease in this channel length direction width, which may be appropriately selected, taking, for example, mechanical strength of each layer and a required distance between source/drain regions into account.

Embodiment 2

Figure 9:
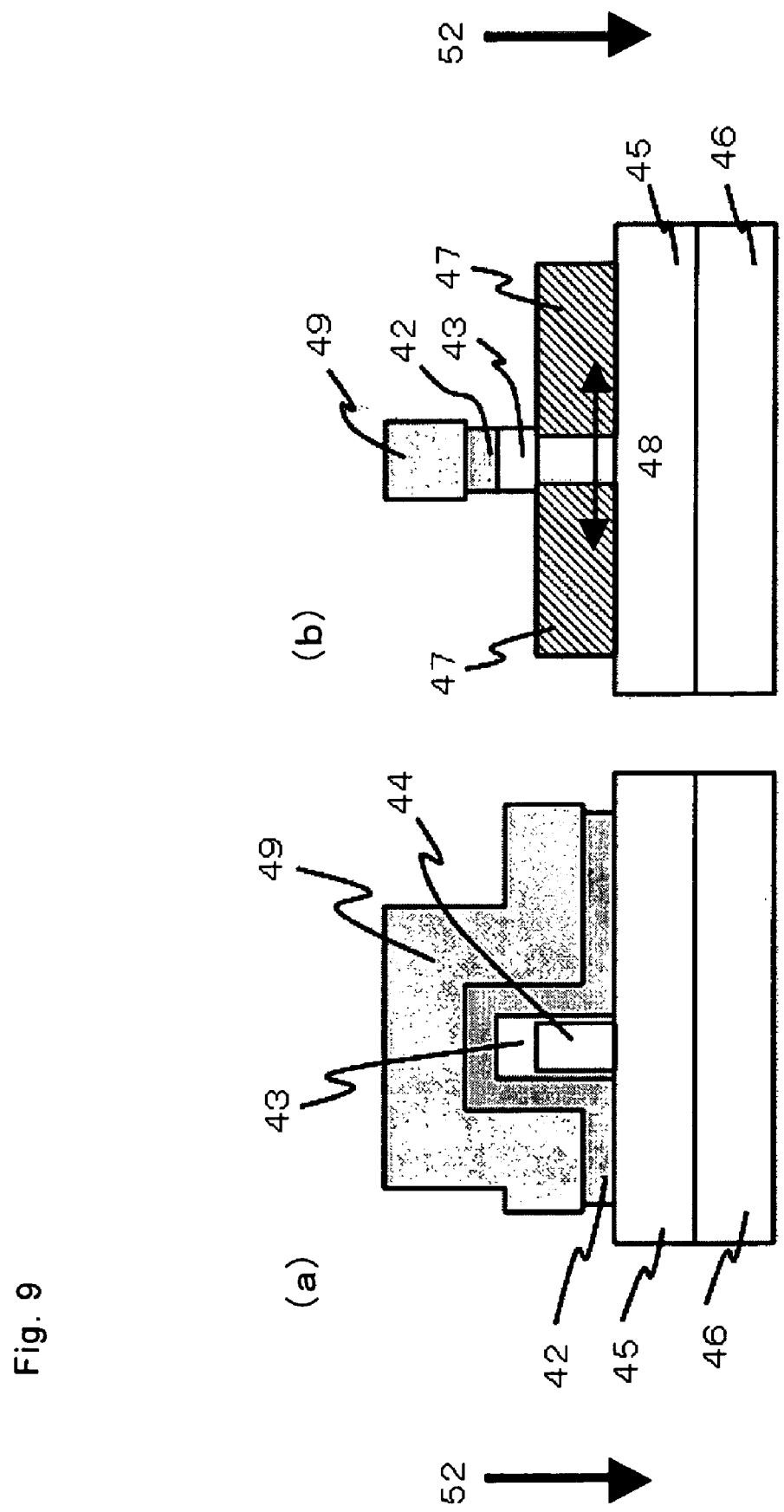
FIG. 9 shows a FinFET of the present invention.

FIG. 9 shows another embodiment of a FinFET according to the present invention. FIG. 9(a) shows a cross section of a FinFET parallel to a gate electrode extension direction and perpendicular to a substrate (corresponding to FIG. 4(b)), and FIG. 9(b) shows a cross section parallel to a channel length direction and perpendicular to the substrate (corresponding to FIG. 4(c)). FIGS. 4 to 8 show a tri-gate type FinFET where a channel region is formed in the top surface and the side surface of the semiconductor layer as an example, while FIG. 9 shows a double-gate type FinFET where a channel region is formed only in the side surface of the semiconductor layer. For obtaining such a double-gate type FinFET, a thicker insulating film formed in the top surface in the semiconductor layer may be formed.

In terms of the top surface of the semiconductor layer in the FinFET of FIG. 9, an insulating film is formed only between the gate electrode and the top surface of the semiconductor layer, but this insulating film may extend to the top surface of the source/drain region. Here, it is preferable to ion-implant a dopant from an oblique direction (a direction perpendicular to a channel length direction and oblique to the normal line direction of the substrate), for preventing the insulating film formed on the top surface of the source/drain region from interfering with ion implantation of dopant into the semiconductor layer to be the source/drain region.

Figure 10:
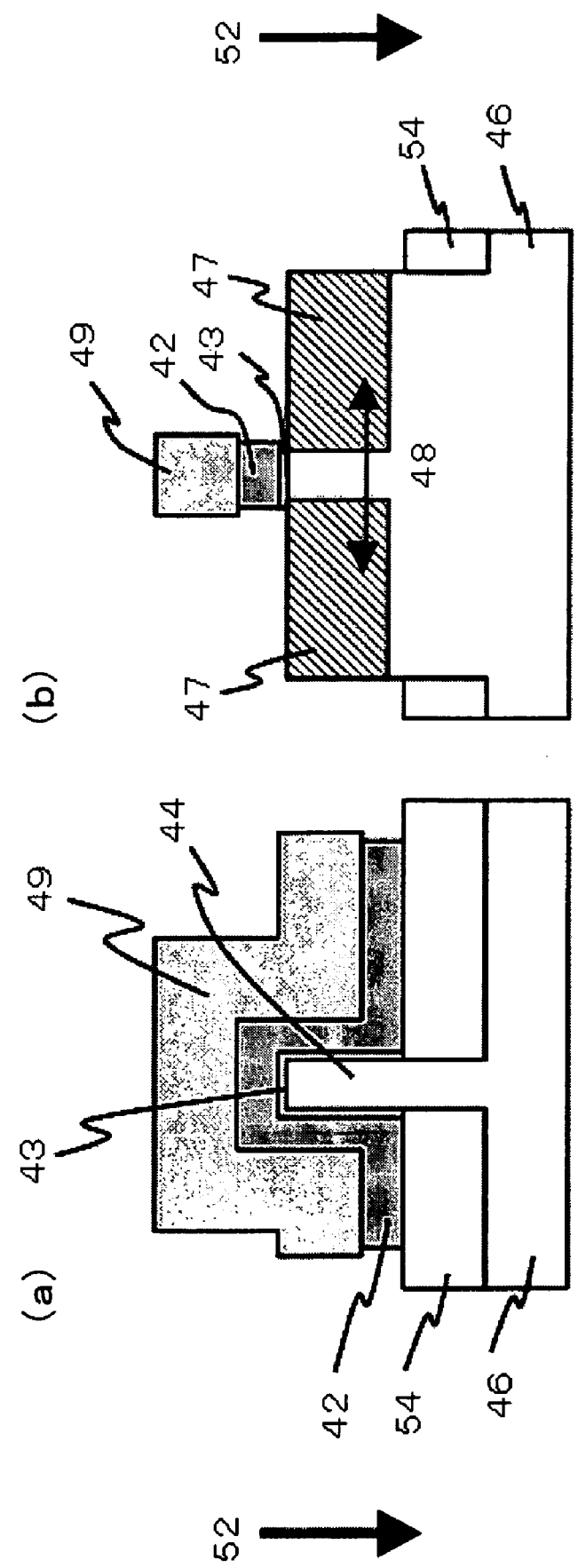
FIG. 10 shows a FinFET of the present invention.

FIG. 10 shows another embodiment of a FinFET according to the present invention. FIG. 10(a) shows a cross section parallel to a gate electrode extension direction in a FinFET and perpendicular to a substrate (corresponding to FIG. 4(b)), and FIG. 10(b) shows a cross section parallel to a channel length direction and perpendicular to the substrate (corresponding to FIG. 4(c)). FIGS. 4 to 9 shows a FinFET formed using an SOI substrate as an example, but as shown in FIG. 10, a FinFET may be formed using a bulk substrate. This FinFET is formed such that a part of semiconductor layer 44 penetrates, from a semiconductor substrate 46 formed in the lower part of the interlayer insulating film 54, the interlayer insulating film 54 as a protrusion from the interlayer insulating film 54. The term, "a substrate plane" as used herein refers to a "given plane parallel to a substrate", which corresponds to, for example, the interlayer insulating film 54 in the FinFET of FIG. 10 and the insulating film layer 45 in the FinFET of FIG. 4. In the FinFET of FIG. 10, the part projecting from the interlayer insulating film 54 functions as a channel region for a transistor. A height of the part functioning as a channel region for a transistor corresponds to a height of the semiconductor layer in the FinFET comprising an SOI structure of, for example, FIG. 4.

Figure 11:
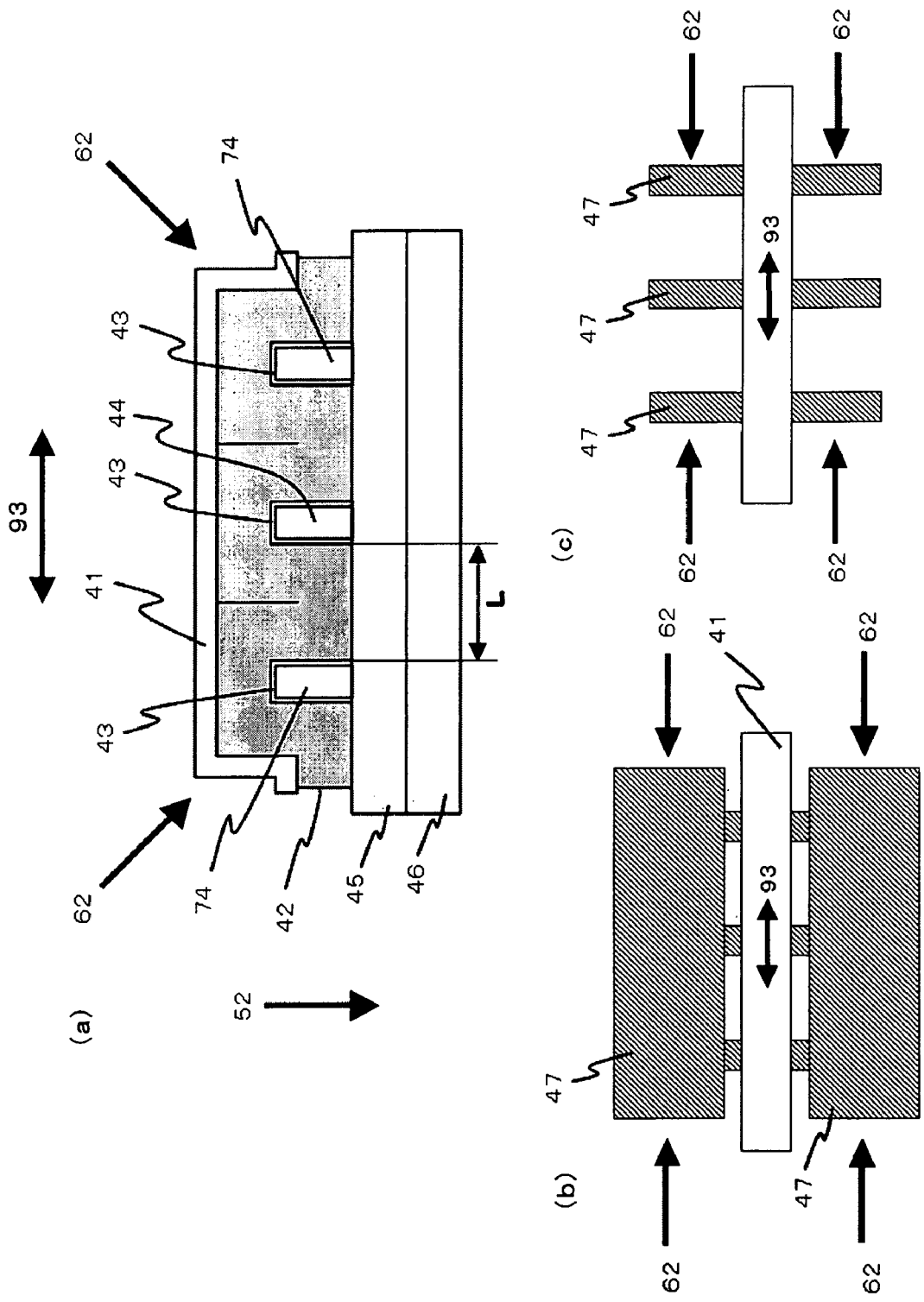
FIG. 11 shows a FinFET of the present invention.

FIG. 11 shows another embodiment of a FinFET according to the present invention. FIGS. 4 to 10 show a FinFET comprising only one semiconductor layer as an example, but as shown in FIG. 11(a), a multi-structure FinFET comprising a plurality of semiconductor layers may be formed. In this FinFET, the semiconductor layers are disposed such that their channel length directions are mutually parallel, and therefore, during ion implantation from an oblique direction 62 (a direction perpendicular to a channel length direction and oblique to the normal line direction of the substrate), these semiconductor layers are under the substantially same implantation conditions, so that a single run of ion implantation can uniformly ion-implant a dopant into each semiconductor layer.

Among the plurality of semiconductor layers, the semiconductor layers 74 formed on the sides comprise an adjacent semiconductor layer in one side, so that the conditions during ion implantation are slightly different from those for a middle semiconductor layer 44. Thus, for more uniform ion-implantation conditions, the side semiconductor layers among the plurality of semiconductor layers may be made dummy semiconductor layers, through which a channel current does not flow. Here, a channel current flows only through the semiconductor layers sandwiched by the side semiconductor layers, in which the conditions of ion-implantation into these semiconductor layers can be made identical.

In this multi-structure FinFET, one gate electrode is formed, which strides over all the semiconductor layers in the direction 93 perpendicular to the channel length direction. In this multi-structure FinFET, a distance between semiconductor layers (a distance L in FIG. 11(a)) is preferably up to five times, more preferably up to three times as large as a channel length direction width of a part adjacent to a gate insulating film in a gate electrode. By controlling a distance between semiconductor layers within such a range, a channel current can be increased. Furthermore, L is desirably up to two times as large as the height of the semiconductor layer. By controlling L within such a range, a substantial channel width (in a tri-gate type FinFET, (a height of a semiconductor layer)×2+(a width in a direction perpendicular to a channel length direction of a semiconductor layer)) becomes larger than a width occupied by a transistor projected on to a plane parallel to the substrate, and thus a driving capacity of a transistor per an occupied area can be improved.

The individual semiconductor layers may be communicated as a common unit as shown in FIG. 11(b) or may be mutually independent as shown in FIG. 11(c). In any type of semiconductor layer, a dopant can be uniformly ion-implanted from a normal line direction of a substrate or from a direction 62 oblique to the normal line direction.

Embodiment 3

FIG. 12 shows another embodiment of a FinFET according to the present invention. In the FinFET of FIG. 12, a gate structure body consists of a single-layer gate electrode. FIG. 12 shows a cross section of a FinFET parallel to a channel length direction and perpendicular to a substrate (corresponding to FIG. 4(c)).

In a FinFET of FIG. 12(a), a channel length direction width of a gate electrode continuously decreases in the direction of an arrow 52 (a direction along a normal line direction of a substrate and toward the substrate side) in a constant rate (in the cross section of FIG. 12(a), a gate electrode side surface is tapered). In this gate electrode, a part adjacent to an insulating film is 81 (bold line), and its width is indicated by "a". In this FinFET, the whole part except the part adjacent to an insulating film in a gate electrode projects to a source and drain region side (both sides) in the channel length direction 48 in comparison with the part 81, and has a width larger than the width "a". Thus, in the cross section of FIG. 12(a), the whole part except the part adjacent to an insulating film in a gate electrode constitutes a protrusion. This protrusion extends over the whole length in a gate electrode extending direction, and the part except the part 81 in the gate electrode forms an eaves structure. In this FinFET, the top surface of the gate electrode can have the largest channel length direction width, allowing gate contact to be facilitated.

In the FinFET of FIG. 12(*b*), a channel length direction width of a gate electrode continuously varies toward the direction of an arrow 52, but it is characterized in that a variation rate is not uniform (in the cross section of FIG. 12(*b*), a gate electrode side surface is curved). In this FinFET, the part 56 (the part surrounded by a dotted line) projects to both sides in the channel length direction 48 in comparison with the part adjacent to an insulating film in a gate electrode and has a width larger than the width "a", and therefore, the part 56 comprises a protrusion. Furthermore, this protrusion extends over the whole length of the gate electrode extending direction, and thus the part 56 forms an eaves structure.

As described above, at least a part of a gate structure body in a FinFET of the present invention may comprise an eaves structure, and its channel length direction width may be continuously varied toward a semiconductor side in a normal line direction of a top surface in the gate structure body on the top surface of the semiconductor layer, or toward a semiconductor side in a normal line direction of the side surface in a gate structure body on the side surface of the semiconductor layer. By continuously varying a channel length direction width, the side surface of the gate structure body smoothly varies in a cross section of the gate structure body (a cross section parallel to a channel length direction and perpendicular to a substrate), so that the gate structure body is resistant to damage during a manufacturing process for a semiconductor device containing a FinFET.

Its variation rate may be constant (the side surface is tapered in a cross section parallel to a channel current direction in the gate structure body and perpendicular to the substrate), or nonconstant (the side surface is curved in a cross section parallel to a channel current direction in the gate structure body and perpendicular to the substrate). Furthermore, its channel length direction width may vary continuously in some part and stepwise (discontinuously) in the other part. In these FinFETs, the gate structure body may is made of a single material layer or a plurality of different material layers.

Embodiment 4

Figure 13:
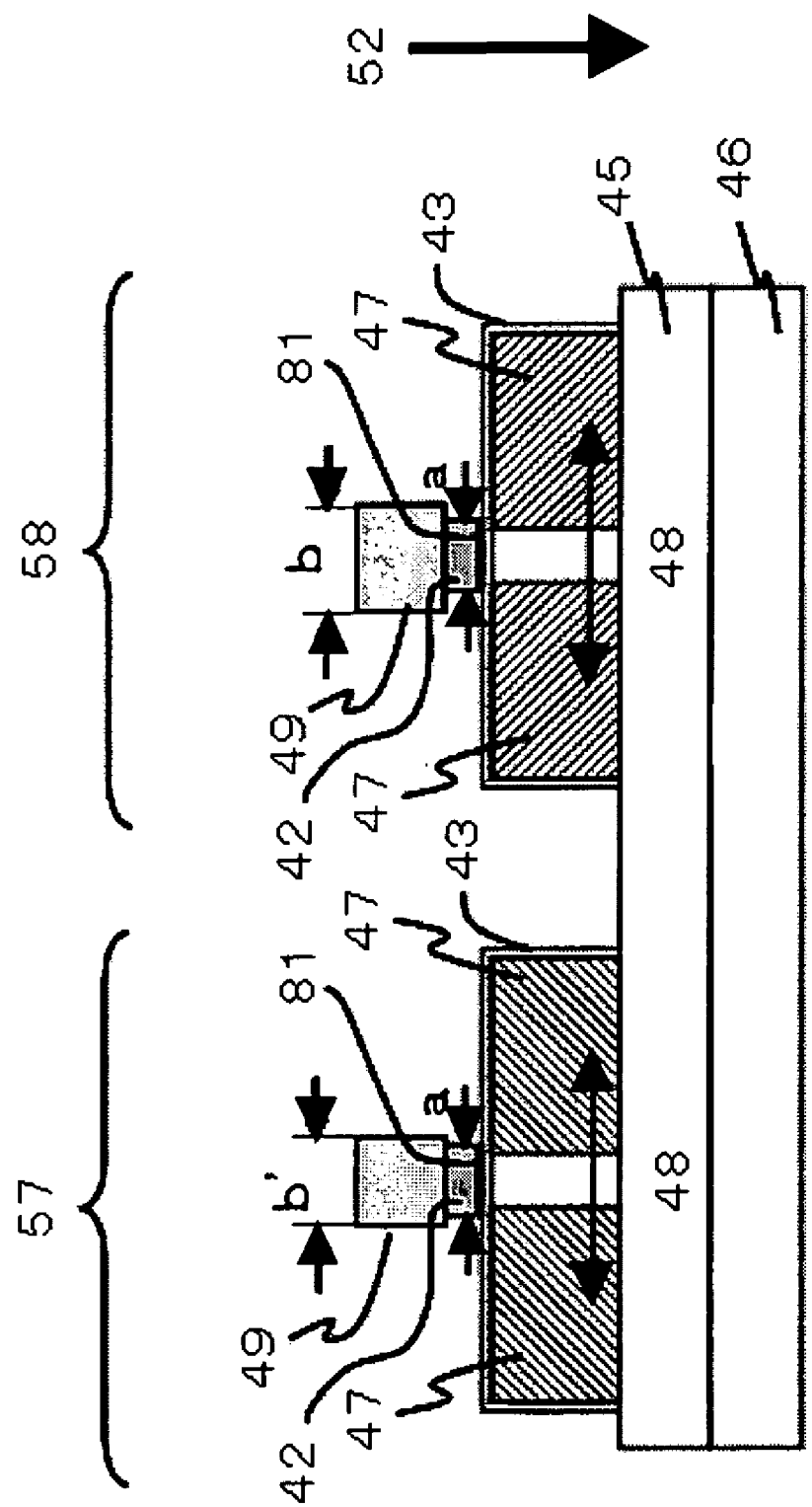
FIG. 13 shows a FinFET of the present invention.

FIG. 13 shows another embodiment of a FinFET according to the present invention. FIG. 13 shows a cross section parallel to a channel length direction of a FinFET and perpendicular to a substrate (corresponding to FIG. 4(*c*)). This semiconductor device consists of two FinFETs, that is, FinFET 57 and FinFET 58, and in each of the FinFETs 57 and 58, a gate structure body is a two-layer gate electrode consisting of a lower gate electrode 42 and an upper gate electrode 49. Furthermore, in each of the FinFETs 57 and 58, a part adjacent to in an insulating film in a gate electrode is 81 (bold line), and an eaves structure is formed in a boundary between the upper gate electrode 49 and the lower gate electrode 42. This semiconductor device is characterized in that a difference between the largest channel length direction width (b') of the protrusion in the FinFET 57 and a channel length direction width (a) of the part 81, that is, b'-a, is smaller than the difference b-a in the FinFET 58.

A difference between the largest channel length direction width of the protrusion and the channel length direction width of the part adjacent to an insulating film in a gate electrode can be varied, depending on FinFET properties as described above, to optimize performance of the overall semiconductor device comprising such a FinFET.

For example, a p-type FinFET tends to have a shorter distance between source/drain regions than an n-type FinFET due to dopant diffusion during heating for forming the source/drain region. Thus, the FinFET 58 is a p-type FinFET while the FinFET 57 is an n-type FinFET in FIG. 13, and in these FinFET 57 and 58, "a" is identical and b>b', so that a protrusion width in the FinFET 58 can be increased to keep a distance between source/drain regions comparable to that in FinFET 57 even when a dopant diffuses during heating. As a result, the overall properties of a semiconductor device comprising a combination of these FinFETs can be optimized.

In FIG. 13, the FinFET 58 may be an n-type FinFET having a higher threshold voltage ($V_{th}$) while the FinFET 57 may be an n-type FinFET having a lower threshold voltage ($V_{th}$), so that an optimized semiconductor device can be obtained.

The reason will be described below. In the n-type FinFET having a higher threshold voltage ($V_{th}$), it is necessary to reduce a drain current leak (GIDL: Gate Induced Drain Leakage) for its operation properties. The GIDL is usually generated by the following mechanism. When a drain voltage is applied to a source region, a drain voltage in a channel length direction and a gate electrical field from a gate electrode are superimposed in an overlap between the drain region and a gate insulating film near an interface with between the drain region and the gate insulating film. Thus, an interband tunnel generates carriers, whose leak leads to a GIDL. For controlling this GIDL, an overlap between the gate insulating film and the drain region may be reduced to reduce a superimposing area of a drain voltage in a channel direction with a gate electrical field from a gate electrode. When the overlap between the gate insulating film and the drain region is reduced, a driving current $I_{on}$ also tend to be reduced, but for the n-type FinFET having a higher threshold voltage ($V_{th}$), a GIDL must be minimized for its device properties even if an $I_{on}$ is reduced.

On the other hand, in the n-type FinFET having a lower threshold voltage ($V_{th}$), a leak current is originally higher, so that reduction of a GIDL is nonsignificant because of its device properties. Therefore, it is preferable to increase $I_{on}$ even if a GIDL is increased, and in the n-type FinFET having a lower threshold voltage ($V_{th}$), a larger overlap between the gate insulating film and the drain region is preferable.

In the present invention, in a semiconductor device comprising a combination of an n-type FinFET having a higher threshold voltage ($V_{th}$) and an n-type FinFET having a lower threshold voltage ($V_{th}$), an overlap can be reduced by increasing a protrusion width (b-a) in its channel length direction in the n-type FinFET having a higher threshold voltage ($V_{th}$), to reduce a GIDL. In the n-type FinFET having a lower threshold voltage ($V_{th}$), the protrusion width (b-a) can be reduced to increase an overlap, resulting in a higher $I_{on}$. A threshold voltage ($V_{th}$) is typically 0.1 to 0.6 V, and a relative threshold difference is generally about 0.1 V or more for adequate effects of a plurality of thresholds.

This relationship is inverted for a semiconductor device comprising a combination of two p-type FinFETs. Specifically, a p-type FinFET having a lower threshold voltage ($V_{th}$) can have a protrusion width (b-a) larger than that in a p-type FinFET having a higher threshold voltage ($V_{th}$), to provide an optimized semiconductor device.

This embodiment is characterized in that a protrusion width (b-a) in an eaves structure is different between two transistors, and as long as such a relationship is met, channel length direction widths of an upper gate electrode and a lower gate electrode can be appropriately selected. That is, FIG. 13 shows two FinFETs in which only a channel length direction width of an upper gate electrode is different, but FinFETs in which further a channel length direction width (that is, a channel length) of a lower gate electrode is different may be used. Alternatively, FinFETs in which only a channel length direction width (that is, a channel length) of a lower gate electrode is different may be used.

Figure 20:
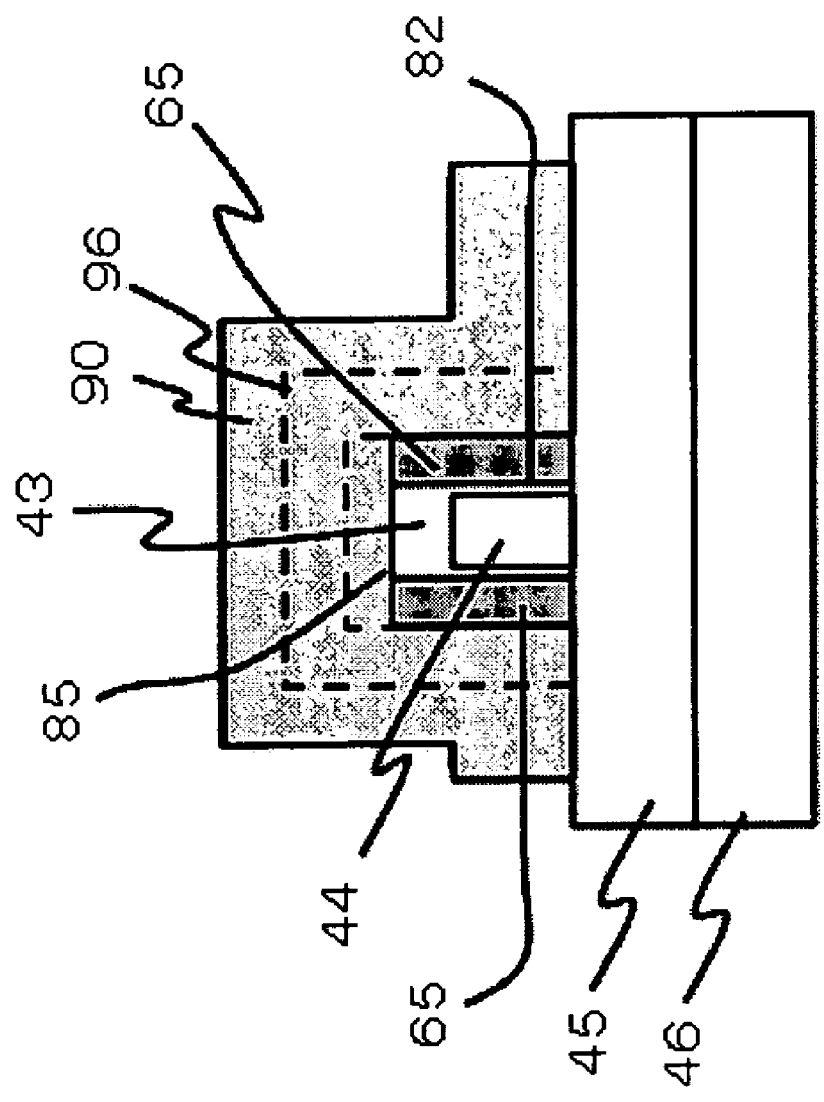
FIG. 20 shows a FinFET of the present invention.

FIG. 20 shows another embodiment of a FinFET according to the present invention. FIG. 20 shows a cross section parallel to a gate electrode extension direction in a FinFET and perpendicular to a substrate (corresponding to the cross-sectional view of FIG. 4(b)). This FinFET is a double-gate type FinFET where an insulating film in the top surface of a semiconductor layer 44 is thick and a channel region is formed only in side surface of the semiconductor layer 44. In this FinFET, side surface gate electrodes 65 are formed on both side surfaces in an insulating film 43, and an upper gate electrode 90 is formed from one side surface gate electrode 65, contacting the top surface 85 of the insulating film 43 and then to the other side surface gate electrode 65 such that it stride over the semiconductor layer 44. That is, the side surface 82 in the insulating film in the gate electrode is in contact with the side surface gate electrode 65, while the top surface 85 of the insulating film is in contact with the upper gate electrode 90.

In this FinFET, the side surface gate electrode 65 corresponds to the lower gate electrode in FIG. 9. The side surface gate electrode 65 (that is, a lower gate electrode) has a channel length direction width smaller than a channel length direction width of the upper gate electrode 90, and this difference in a channel length direction width forms an eaves structure in a boundary between these (the dotted-line part 96 in FIG. 20 comprises a protrusion to form an eaves structure). In the FinFET of FIG. 9, the upper gate electrode having a larger width is supported by the lower gate electrode having a smaller width, while in the FinFET of FIG. 20, the upper gate electrode having a larger width is directly in contact with the insulating film 45 to be a substrate. Thus, even when a width of a side surface gate electrode (a lower gate electrode) is reduced, high mechanical strength of a gate electrode can be maintained.

In the upper gate electrode 90, it is sufficient for maintaining high mechanical strength of a gate electrode to form at least a part adjacent to the side surface gate electrode 65, which has a channel length direction width larger than that of the side surface gate electrode 65.

Manufacturing Process for a FinFET

In comparison with a conventional manufacturing process, a process for manufacturing a FinFET of the present invention is characterized in that a gate structure body is processed for forming an eaves structure. There will be detailed the process for manufacturing a FinFET of the present invention.

First, by lamination or SIMOX, an SOI (Silicon On Insulator) substrate is prepared, which has, on a silicon substrate 46, a buried insulating layer 45 made of $SiO_2$ with a thickness of 100 nm, on which a monocrystalline silicon semiconductor layer with a thickness of 120 nm. Next, an $Si_3N_4$ film with a thickness of 50 nm is deposited on the top surface of the semiconductor by CVD.

Then, a resist pattern is formed by lithography and using the pattern as a mask, the $Si_3N_4$ film is patterned by etching such as RIE. Subsequently, after removing the resist, the semiconductor is patterned by selective RIE (Reactive Ion Etching) where an etching rate to silicon is larger than an etching rate to the $Si_3N_4$ film, using a remaining $Si_3N_4$ film as a mask. Thus, a semiconductor layer 44 is formed, which projects from the substrate plane (an insulating film) and on which the $Si_3N_4$ film is laminated.

Figure 14:
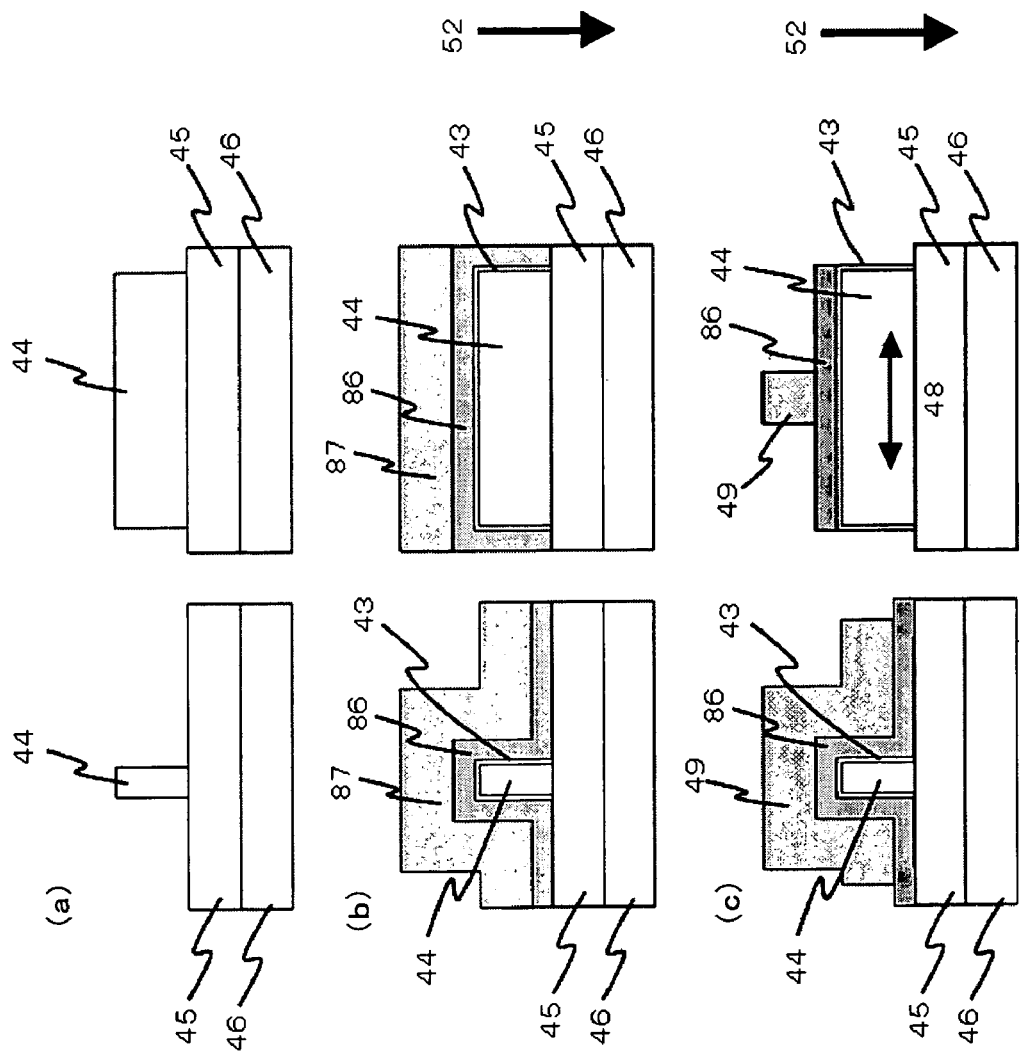
FIG. 14 shows a process for manufacturing a FinFET of the present invention.

Subsequently, the $Si_3N_4$ film is removed by, for example, hot phosphoric acid. Now, Si is exposed from the side surface and the top surface of the semiconductor layer 44. FIG. 14(a) shows this status.

Then, a gate insulating film 43 is formed on the exposed Si surface. A preferable example of forming the gate insulating film 43 is oxidizing the exposed Si surface by radical oxidation at about 700° C. to about 2.5 nm. This radical oxidation is substantially independent of a plane direction of the semiconductor layer, to provide a less hubbly gate insulating film 43.

The gate insulating film 43 is not limited to an $SiO_2$ film formed using radical oxidation, but an SiON film can be used. An SiON film can be formed by forming a common thermally-oxidized film by, for example, thermal oxidation and then nitriding its surface with a nitrogen-containing gas. Here, for providing a double-gate type FinFET, a semiconductor layer side surface may be oxidized while $Si_3N_4$ film is laminated on the top surface of the semiconductor layer without removing the above $Si_3N_4$ film. When forming a double-gate type FinFET, it is preferable to laminate an $SiO_2$ film in place of an $Si_3N_4$ film on the top surface of the semiconductor layer because of its lower dielectric constant.

Next, a gate structure body material is laminated over the whole surface. FIG. 14(b) shows this status (step (a): FIG. 14(b) shows, as an example, a gate electrode material laminated as two layers consisting of a lower gate electrode material 86 and an upper gate electrode material 87). A gate structure body material may be a single laminated layer made of a single material or a plurality of laminated layers made of different materials. Typically, two layers of a lower gate electrode material and a gate cap insulating film material can be laminated.

A gate structure body material may be, but not limited to, a polysilicon film, and further may be a metal film; a laminated gate structure of a metal film and a metal film; a laminated gate structure of a polysilicon film and a metal film; or a laminated gate structure of a polysilicon film and a suicide film.

A metal film may be a low-resistance layer comprising Mo, W, Ta, Ti, Hf, Re, Ru, Al, Cu or an alloy containing at least one of these metal elements (containing at least one metal element selected from the group consisting of Mo, W, Ta, Ti, Hf, Re, Ru, Al and Cu). A silicide film may be a low-resistance layer comprising an Ni—Si compound, Co—Si compound, Ti—Si compound, W—Si compound, Ta—Si compound, Pt—Si compound or Er—Si compound. In addition, a gate structure body material may be a layer comprising Si, Ge, SiGe, TiN, TaN, HfN or WN. In terms of these layers, alone or a plurality of layers may be laminated. When laminating a plurality of layers as a gate structure body material, the top layer is preferably a low-resistance layer such as a metal layer made of Mo, W, Ta, Ti, Hf, Re, Ru, Al, Cu or an alloy of these elements or a silicide layer in the light of gate contact.

Alternatively, a gate structure body material may be formed by a plurality of polysilicon layers having different dopant concentrations. For forming such a layer, the conditions (a flow rate of a dopant gas, a substrate bias, a temperature and so forth) during lamination of each layer may be varied.

Subsequently, the gate structure body material is processed such that it comprises an eaves structure (step (b)). Such processing can be conducted by a variety of methods. Examples include (1) etching using an upper-layer gate structure body material as a mask, and (2) one-step etching. These methods will be described below.

(1) Etching Using an Upper-Layer Gate Structure Body Material as a Mask

A plurality of layers are laminated as a gate structure body material by the above process, and then a resist mask is formed on the whole surface. Then, a resist pattern is formed by lithography. Next, using the resist pattern as a mask, the layers other than the layer adjacent to the insulating film in the gate structure body material is anisotropically etched, and then the mask is removed (step (d)). FIG. 14(c) shows this status (FIG. 14(c) shows an example where a gate electrode consists of two layers and the layer 49 has been formed by the above anisotropic etching).

Figure 16:
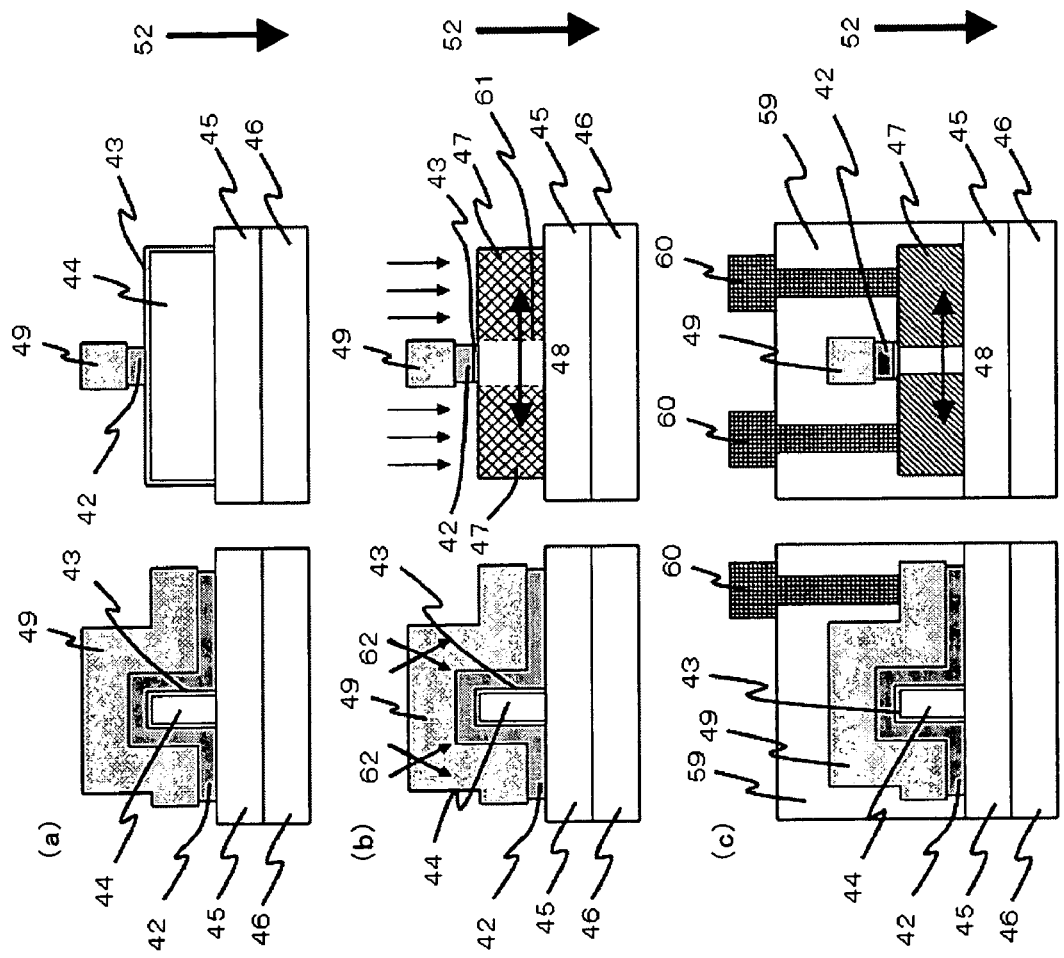
FIG. 16 shows a process for manufacturing a FinFET of the present invention.

Then, using the layer anisotropically etched in the preceding step (in FIG. 14(c), the layer 49) as a mask, the layer adjacent to the insulating film in the gate structure body material (in FIG. 14(c), a lower gate electrode material 86) is etched. Here, the etching conditions are selected such that the layer adjacent to the insulating film is etched not only in its thickness direction (a direction toward the substrate side along the normal line direction of the substrate: the direction indicated by an arrow 52), but also in its channel length direction 48. By this etching, the layer 42 has a channel length direction width smaller than that of the layer 49 formed by anisotropic etching in the preceding step. Thus, an eaves structure is formed (step (e)). FIG. 16(a) shows this status. This etching may be isotropic etching. When employing isotropic etching, it is easy to control a difference between the largest channel length direction width "b" in the protrusion and a channel length direction width "a" of the part adjacent to the insulating film in the gate electrode, that is, "b-a".

Etching of the lower gate electrode material 86 is not necessarily complete isotropic etching, but may be etching in which an etching rate in a thickness direction is different from that in a channel length direction. This etching may be, for example, such that etching proceeds in a thickness direction while erosion proceeds in a channel length direction. This erosion in a channel length direction is caused by a chemical reaction of an etchant gas with a gate electrode material, and the chemical reaction for erosion can be regulated at a desired reaction rate by selecting a material as the gate electrode material and the etching conditions (an etching style, an applied power, a substrate bias, a gas used, a gas flow rate and so forth).

When the gate structure body material consists of a plurality of layers, etching can be conducted, varying the etching conditions for etching of each layer.

(2) One-Step Etching

In this method, first, a gate structure body material is laminated as described in the above (1) to the step of FIG. 14(b). Then, a resist mask is formed over the whole surface and then a resist pattern is formed using lithography. Next, using this resist pattern as a mask, all the gate structure body material is etched. Here, when the material constituting the gate structure body consists of a plurality of layers, it is necessary to regulate etching of the layer adjacent to the insulating film such that the etching proceeds at least in its thickness direction (a direction toward the substrate side along the normal line direction of the substrate: the direction indicated by the arrow 52) and in a channel length direction 48, provided that the way of etching of each layer depends on the type of the material and etching conditions. It is preferable to control etching of this layer adjacent to the insulating film such that the etching is isotropic. Isotropic etching allows the width difference "b-a" to be easily controlled. Etching of the layer adjacent to the insulating film is not necessarily complete isotropic etching, but it may be etching such that an etching rate in a thickness direction is different from that in a channel length direction.

In any etching process, it is necessary to control the etching such that in at least one layer of the layers separate from the insulating film in the gate structure body material, etching does not proceed in a channel length direction or, if any, an etching rate in the channel length direction is lower than an etching rate in a channel length direction in the layer adjacent to the insulating film.

By such etching, the layer adjacent to the insulating film has a channel length direction width smaller than that of the upper layers, resulting in formation of an eaves structure. FIG. 16(a) shows this status.

For conducting isotropic etching or etching where an etching rate in a thickness direction is different from that in a channel length direction, the etching operation conditions (an etching style, an applied power, a substrate bias, the type of a gas used, a gas flow rate and so on) may be appropriately regulate, depending on a gate structure body material. In an exemplary method, a two-layer gate electrode material is laminated, and the upper gate electrode in this gate electrode material may be made of a material less reactive to chlorine radical while the lower gate electrode may be made of a material highly reactive to chlorine radical.

In this method, for example, W and Si are used as the upper and the lower gate electrodes, respectively. Since W does not easily form a chloride, only Si as the lower gate electrode can be etched by a radical reaction. An insulating film such as $SiO_2$ and SiN instead of W may be similarly effective. For forming this side etch shape, it is preferable that an inductively-coupled type plasma etching device is used; a pressure, a power applied to an induction coil and a substrate bias are set to 1 mTorr to 300 mTorr, 200 to 2000 W and 0 to 100 W, respectively; and gases such as $Cl_2$ and $BCl_3$ are introduced at 50 to 1000 sccm to generate plasma, which is used under control. However, as long as a similar shape can be obtained, a device used is not limited to an inductively-coupled type plasma etching device.

Furthermore, in a manufacturing process of the present invention, the etching operation conditions can be appropriately controlled to produce a FinFET in which a channel length direction width of the gate structure body continuously decreases at a constant rate (a side surface is tapered in a cross section parallel to a channel current direction in the gate structure body and perpendicular to the substrate). FIG. 15 shows this status.

This FinFET can be manufactured by, for example, a damascene gate process. In this process, first, an insulating film is formed on the semiconductor layer. Then, after depositing an interlayer insulating film over the whole surface, etching is conducted to form a forward tapered template within the interlayer insulating film. Next, a gate structure body material is buried in this template by dry etching back to form a FinFET.

For etching the interlayer insulating film, it is preferable to use, under control, a plasma generated by introducing a fluorocarbon gas such as $CF_4$, $CHF_3$, $CH_2F_2$, $C_4F_8$, $C_5F_8$ and $C_4F_6$ diluted in argon in a total amount of 100 to 2000 sccm under the conditions of a pressure: 10 mTorr to 300 mTorr, a power applied to the upper electrode: 500 to 2000 W and a substrate bias: 100 to 1500 W, using a parallel plate type plasma etching device. A small amount of oxygen may be added for controlling a taper angle. However, as long as a similar shape can be obtained, the device is not limited to a parallel plate type plasma etching device.

As described above, a rate of decrease in a channel length direction width (a taper angle) can be controlled to a desired value by regulating the operation conditions, but it is preferably 5 to 20°, more preferably 5 to 10° to the normal line direction of the substrate plane in the light of mechanical strength of the eaves structure and a distance between source/drain regions.

Thus, in the process of the present invention, the etching operation conditions can be controlled to form a gate structure body where a semiconductor layer has a channel length direction width continuously or stepwise varying in a normal line direction of its top surface on the top surface and in a normal line direction of its side surface on the side surface. In the case of continuous or stepwise variation, a variation rate of width may be constant or not.

Subsequently, using the gate structure body as a mask, a dopant is ion-implanted from a direction 62 oblique to the normal line direction of the substrate (a direction perpendicular to the channel length direction and oblique to the normal line direction of the substrate), to form a source/drain region. FIG. 16(b) shows this status (step (c)). Here, in the FinFET of the present invention, at least a part of its gate structure body comprises an eaves structure, so that the eaves structure acts as a mask to ion implantation from an oblique direction and therefore, the dopant is not ion-implanted in a part which is to be a shadow area to ion implantation of the semiconductor layer (in FIG. 16(b), a white-ground area of the semiconductor layer 44). The other part in the semiconductor layer can be uniformly ion-implanted with the dopant to the bottom, to give a FinFET having excellent element properties and operation properties. This oblique ion implantation is particularly effective when a height of the semiconductor layer is equal to or more than a length in a channel length direction in a part adjacent to the insulating film in the semiconductor layer.

Ion implantation can be conducted from the normal line of the substrate. In the FinFET of the present invention, an eaves structure is formed at least on the top surface of the semiconductor layer, so that the eaves structure also acts as a mask to ion implantation from the normal line direction and thus the dopant is not implanted to the semiconductor layer under the eaves structure. As a result, a distance between source/drain regions can be kept constant. Furthermore, such a configuration can avoid problems such as damage in a substrate associated with etching back as in forming a gate side wall.

In terms of ion-implantation conditions, for example, arsenic ions (As$^+$) at an acceleration voltage of 0.5 to 10 keV for forming an n-type source/drain region or boron ions (B$^+$) at an acceleration voltage of 0.1 to 2 keV for forming a p-type source/drain region can be implanted at about $5 \times 10^{15}$ cm$^{-2}$.

When conducting ion implantation from an oblique direction, there are no particular restrictions to an angle of this ion implantation. However, when another element is further mounted on the substrate, the angle is preferably more than 0° and 45° or less, more preferably more than 0° and 30° or less, further preferably 10° to 30° both inclusive to the normal line direction of the substrate for preventing the additional element from interfering with ion implantation.

Then, the source/drain region is activated by heating. A depth of the source/drain region is controlled by thermal activation after forming a final ion implantation layer and heating conditions. In the FinFET of the present invention, the eaves structure formed in the gate structure body allows for keeping a distance between source/drain regions constant to ensure a substantial channel length (in FIG. 16(c), a the white-ground area in the semiconductor layer 44 is a channel region).

When it is necessary to reduce a specific resistance in the source/drain region 47, a silicide layer (not shown) may be formed on the surface of the source/drain region. Examples of a silicide layer include TiSi$_2$, CoSi$_2$, PtSi, Pd$_2$Si, IrSi$_3$, RhSi and NiSi.

Then, SiO$_2$ is deposited to, for example, about 500 nm on this structure by CVD. Thus, an interlayer insulating film 59 is formed. Next, the interlayer insulating film 59 is planarized by CMP.

Next, a contact hole is formed within the interlayer insulating film 59 by lithography and RIE. Then, are laminated a thin TiN (titanium nitride) film/a Ti (titanium) film, on which is then laminated a W (tungsten) film or Al (aluminum) film for filling the contact hole. Thus, a contact plug is formed within the contact hole. Subsequently, an interconnection layer 60 electrically contacting with the contact plug is formed on the interlayer insulating film. The interconnection layer is, for example, made of a conductive material comprising aluminum as a main component. Then, a passivation film (not shown) is deposited on the interlayer insulating film and the interconnection layer to form a FinFET of the present invention. FIG. 16(c) shows this status.

There has been the manufacturing process using an SOI substrate, but a FinFET may be manufactured using a bulk substrate.

In the manufacturing process of the present invention, a multi-structure FinFET may be manufactured. For preparing this multi-structure FinFET, in semiconductor layer formation, a plurality of semiconductor layers may be formed such that their channel length directions are mutually parallel and in gate structure body formation, a single gate electrode may be formed such that it strides over the plurality of semiconductor layers in a direction perpendicular to the channel direction. The later procedure can be conducted as described in the above process, to prepare a FinFET. In the multi-structure FinFET, the individual semiconductor layers are disposed such that their channel current directions are parallel, so that ions can be uniformly implanted into each semiconductor layer by a single ion-implantation run.

Another Manufacturing Process of the Present Invention

Figure 17:
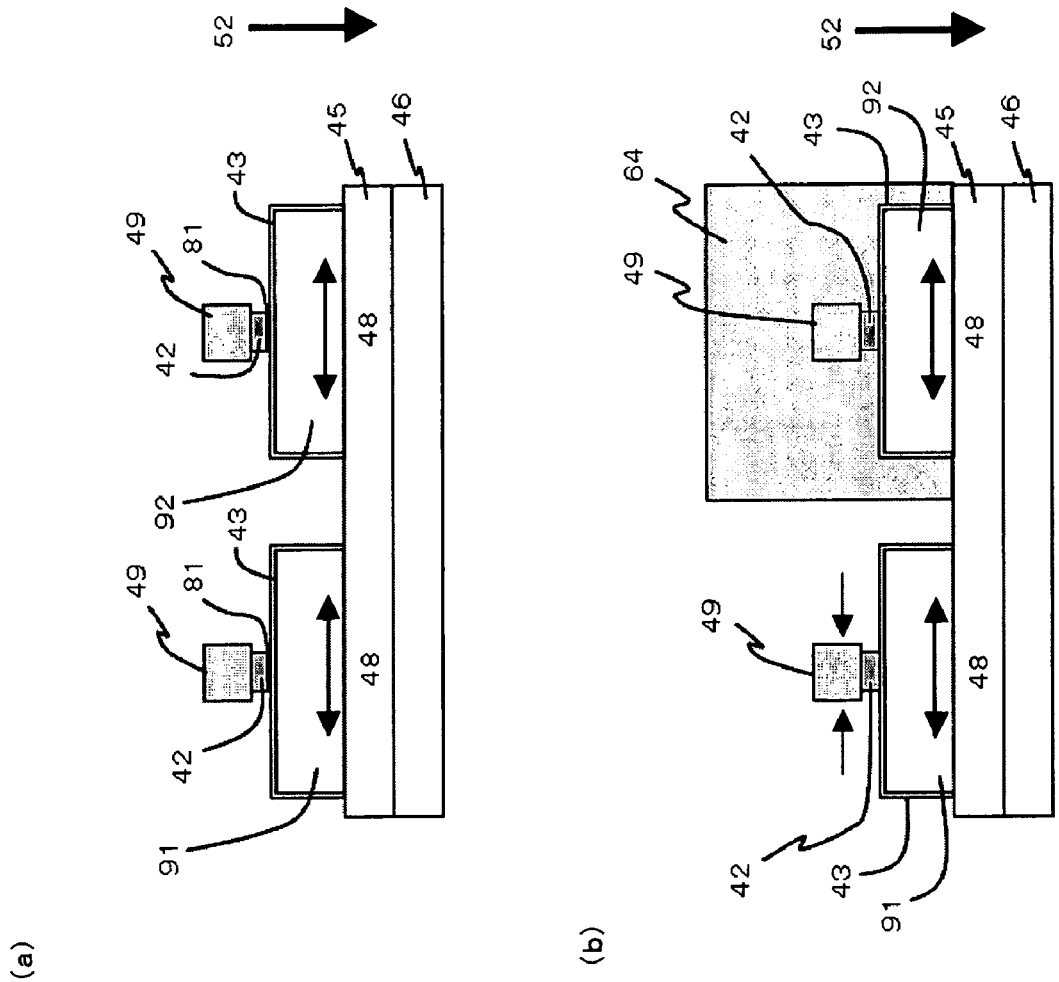
FIG. 17 shows a process for manufacturing a FinFET of the present invention.
Figure 18:
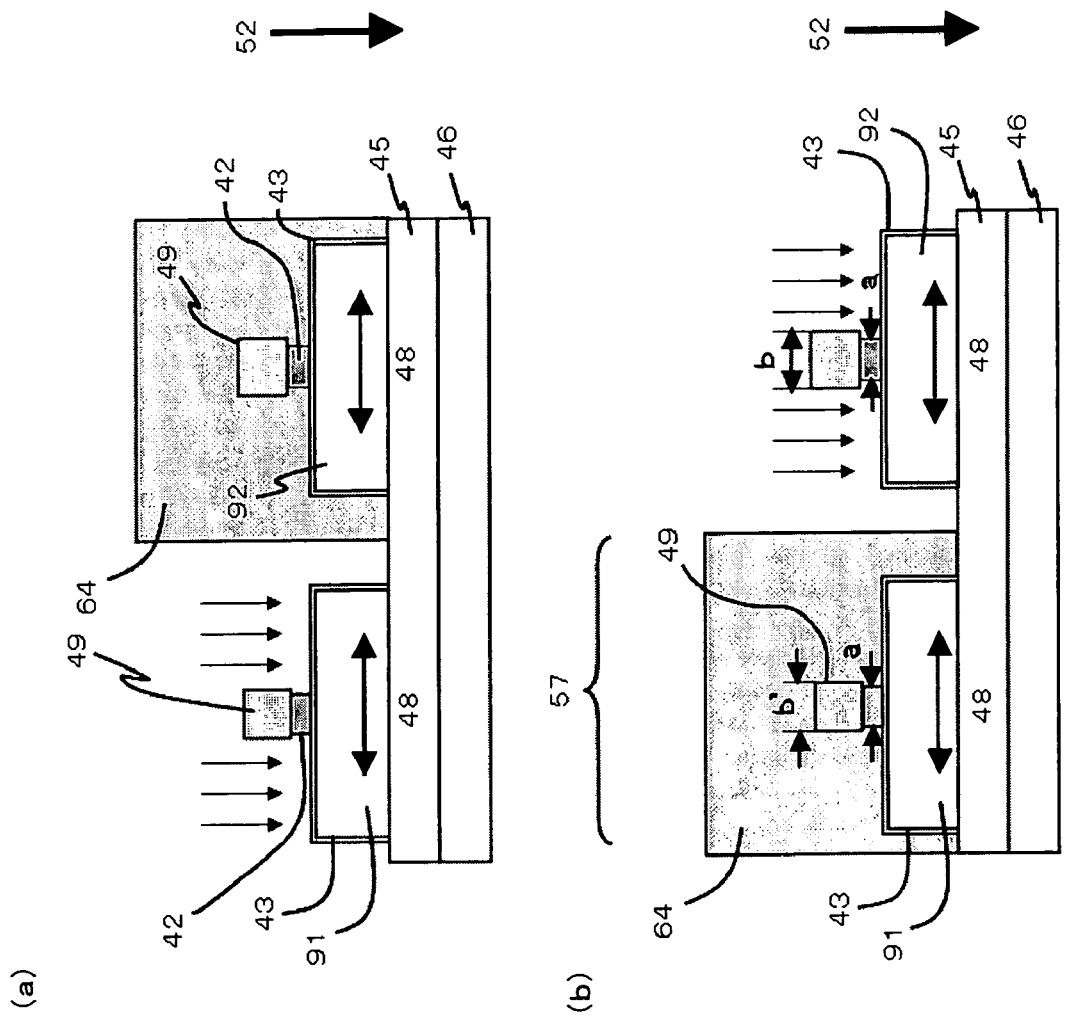
FIG. 18 shows a process for manufacturing a FinFET of the present invention.
Figure 19:
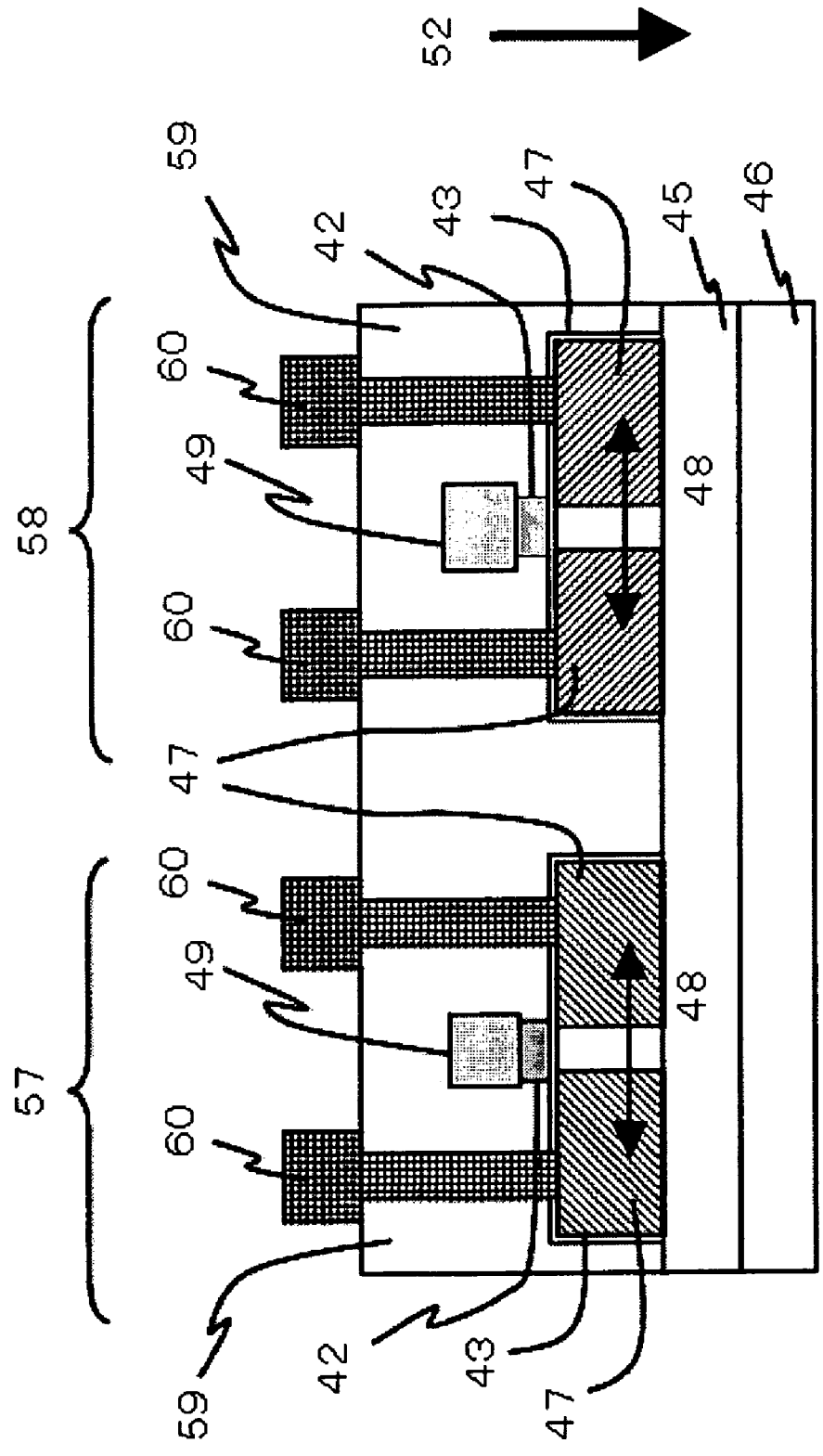
FIG. 19 shows a process for manufacturing a FinFET of the present invention.

In another manufacturing process of the present invention, a FinFET of FIG. 13 can be manufactured. This FinFET comprises two FinFETs 57 and 58, and is characterized in that a difference between the largest channel length direction width "b" in a protrusion in the FinFET 57 and a channel length direction width "a" of a part adjacent to an insulating film in a gate electrode, that is, "b-a" is smaller than a width difference "b-a" in the FinFET 58. FIGS. 17 to 19 show an example of a process for manufacturing this FinFET.

First, to the step of FIG. 16(a), two semiconductor layers comprising a gate structure body with an eaves structure are formed as described in the above (1) or (2). FIG. 17(a) shows this status. Next, after forming a mask over the whole surface, the mask except the mask 64 on the semiconductor layer 92 is removed by lithography. Then, the layer 49 formed on the semiconductor layer 91 is further etched to make a channel length direction width smaller than that in the layer 49 on the semiconductor layer 92 (additional lateral etching: etching in a channel length direction). Here, the materials for the layers 42 and 49 and the etching conditions are controlled such that only the layer 49 is etched while the layer 42 is not etched (step (f)). FIG. 17(b) shows this status.

Then, using the gate structure body as a mask, the semiconductor layer 91 is ion-implanted with a dopant from a direction oblique to the normal line direction of the substrate, to form a source/drain region, providing the FinFET 57 (step (h)). FIG. 18(a) shows this status. Subsequently, the mask 64 formed on the semiconductor layer 92 is removed and then a mask is formed over the whole surface, and then the mask except the mask 64 on the FinFET 57 is removed by lithography.

Then, using the gate structure body as a mask, the semiconductor layer 92 is ion-implanted with a dopant from a direction oblique to the normal line direction of the substrate, to form a source/drain region, providing the FinFET 58 (step (g)). Dopant ion-implantation in steps (g) and (h) may be conducted from the normal line direction of the substrate plane. FIG. 18(b) shows this status. Next, after the mask 64 formed on the FinFET 57 is removed, an interlayer insulating film 59, a contact plug, an interconnection 60 and so on are formed as described above (the step in FIG. 16(c)), to provide a FinFET. FIG. 19 shows this FinFET.

Thus, when forming FinFETs where differences between the largest channel length direction width in a protrusion and a channel length direction width in a part adjacent to an insulating film in a gate electrode are different mutually, the above manufacturing process can be employed to readily produce them by one run. That is, for an n-type FinFET or a p-type FinFET, it is necessary to implant a different ion species into a part to be a source/drain region in a semiconductor layer. In the manufacturing process of the present invention, a mask used here can be also used as a mask for adjusting a channel length direction width of the eaves structure such that it becomes different between the n-type FinFET and the p-type FinFET. As a result, in comparison with a conventional MOSFET, a semiconductor device comprising a combination of MOSFETs with a different channel length direction width of an eaves structure can be manufactured without increasing the number of steps.

In the above manufacturing process, 1) additional lateral etching and forming a source/drain region are conducted to provide the FinFET 57, and 2) a source/drain region is formed in the semiconductor layer 92 to form the FinFET 58, but the order of the steps 1) and 2) may be reversed.

In the above manufacturing process, the layer 42 is not etched and only the layer 49 is etched to make the eaves width "b-a" of the FinFET 57 smaller than the eaves width of the FinFET 58, but conversely, the layer 49 may not be etched while only the layer 42 being etched to make the eaves width of the FinFET 58 larger than that of the FinFET 57.

The semiconductor device of FIG. 13 may be manufactured by another process. In this process, after forming two semiconductor layers in which a gate structure body material has been laminated (a first semiconductor layer and a second semiconductor layer), the gate structure body materials laminated on the semiconductor layers are separately processed to form an eaves structure. Specifically, in this process, first, a mask (hereinafter, referred to as "mask A") is formed on the first semiconductor layer and a gate structure body material laminated on the first semiconductor layer of the two semiconductor layers on which a gate structure body material is laminated, to form an eaves structure. Next, the gate structure body material laminated on the second semiconductor layer is processed to form an eaves structure, providing a second FinFET. Then, the mask A is removed, and a mask (hereinafter, referred to as "mask B") is formed on the second FinFET. Then, the first semiconductor layer and the gate structure body material laminated on the first semiconductor layer are processed to form an eaves structure, providing a first FinFET. Then, the mask B is removed to provide the semiconductor device of FIG. 13. In this process, by varying the processing conditions for the gate structure body materials laminated on the first semiconductor layer and the second semiconductor layer, a "b-a" can be varied between the first and the second FinFETs.

By selecting ion species to be ion-implanted into these semiconductor layers 91 and 92, FinFET 57 may be an n-type FinFET while the FinFET 58 may be a p-type FinFET.

Furthermore, as described above, the amount of a dopant implanted into a semiconductor layer to be a channel region can be varied or a work function of a gate electrode may be varied during ion-implanting a dopant into the semiconductor layers 91 and 92, to provide the FinFET 57 as an n-type FinFET having a lower threshold voltage ($V_{th}$) and the FinFET 58 as an n-type FinFET having a higher threshold voltage ($V_{th}$) (it is also possible to provide the FinFET 58 as a p-type FinFET having a lower threshold voltage ($V_{th}$) and the FinFET 57 as a p-type FinFET having a higher threshold voltage ($V_{th}$) by varying the amount of a dopant and a work function).

In the present invention, a FinFET of FIG. 20 may be manufactured. In this manufacturing process, the process as described above can be conducted up to the step of forming a semiconductor layer in FIG. 14(a) and the step of forming an insulating film on the semiconductor layer. However, in this manufacturing process for a FinFET, first, a side surface gate electrode material is laminated and then etching back is conducted, to form a side surface gate electrode 65 on the side surface of the insulating film. Then, an upper gate electrode material is laminated and then an eaves structure is formed in the upper gate electrode by the manufacturing process as described in, for example, the above (1) or (2).

Furthermore, in the manufacturing process of the present invention, a damascene gate structure FinFET can also be manufactured. This manufacturing process is effective for forming a gate electrode made of a material which is hard to be shaped, such as a metal gate electrode (W, WSi, CoSi, NiSi, TiN and Ti).

In this manufacturing process, first, the process as described above is employed to form a semiconductor layer, an insulating film, a polysilicon film and a dummy gate electrode consisting of a gate cap insulating film ($SiO_2$, SiN) comprising an eaves structure. Then, using the dummy gate electrode as a mask, a dopant is ion-implanted to form a source/drain region and to thermally activate the source/drain region. Then, an interlayer insulating film is deposited over the whole surface. The interlayer insulating film can be deposited by CVD or sputtering. Subsequently, after planarization by CMP or dry etching, the interlayer insulating film is etched back to expose the head of the dummy gate electrode. Here, the gate cap insulating film in the head of the dummy gate electrode acts as an etching stopper. Then, the gate gap insulating film in the dummy gate electrode is removed. The gate gap insulating film can be removed with hot phosphoric acid (180° C.).

After removing the gate gap insulating film, the polysilicon film is removed. The polysilicon film can be dissolved in an alkaline solution such as TMAH (a tetraammonium hydroxide solution), but it may be removed by chemical dry etching using $CF_4+O_2$. Furthermore, for example, a metal gate electrode material is deposited to form a metal gate electrode. The metal gate electrode material is buried in the space after removing the dummy gate, by dry etching back.

The invention claimed is:
1. A field effect transistor, comprising:
 a semiconductor layer protruding from a substrate plane,
 a gate structure body comprising a gate electrode extending from one side surface through a top surface to the other side surface of the semiconductor layer such that it strides over the semiconductor layer, on the one side surface and the other side surface of the semiconductor layer, an insulating film formed between the semiconductor layer and the gate electrode, and source/drain regions formed on both sides sandwiching the gate electrode in the semiconductor layer, wherein channel regions are formed at least in the one side surface and the other side surface of the semiconductor layer, wherein the gate structure body comprises an eaves structure which is formed by extending a protrusion which projects on each side respectively of the source and drain regions in a channel length direction and which has a channel length direction width larger than a part adjacent to the insulating film in the gate electrode, at least over the top surface of the semiconductor layer in a gate electrode extending direction, and the gate structure body comprises a part, on the top surface of the semiconductor layer, where the channel length direction width reduces stepwise along a normal line direction of the top surface towards the semiconductor layer, and the gate structure body further comprises a part, on the one side surface and the other side surface of the semiconductor layer, where the channel length direction width reduces stepwise along a normal line direction of the one side surface and the other side surface of the semiconductor layer towards the semiconductor layer.

2. A semiconductor device comprising at least first and second semiconductor devices, wherein the first semiconductor device comprises the first field effect transistor as claimed in claim 1, and the second semiconductor device comprises the second field effect transistor as claimed in claim 1, wherein said stepwise channel length reduction on the top surface of the semiconductor layer along a normal line direction of the top surface towards the semiconductor layer is larger in said first field effect transistor than in said second field effect transistor.

3. The semiconductor device as claimed in claim 2, wherein the first field effect transistor is a p-type field effect transistor, and the second field effect transistor is an n-type field effect transistor.

4. A field effect transistor, comprising:

a semiconductor layer protruding from a substrate plane, a gate structure body comprising a gate electrode extending from one side surface through a top surface to the other side surface of the semiconductor layer such that it strides over the semiconductor layer, on the one side surface and the other side surface of the semiconductor layer, an insulating film formed between the semiconductor layer and the gate electrode, and source/drain regions formed on both sides sandwiching the gate electrode in the semiconductor layer, wherein channel regions are formed at least in the one side surface and the other side surface of the semiconductor layer, wherein the gate structure body comprises an eaves structure which is formed by extending a protrusion which projects on each side respectively of the source and drain regions in a channel length direction and which has a channel length direction width larger than a part adjacent to the insulating film in the gate electrode, at least over the top surface of the semiconductor layer in a gate electrode extending direction, and the gate structure body comprises a part, on the top surface of the semiconductor layer, where the channel length direction width reduces stepwise along a normal line direction of the top surface towards the semiconductor layer, and the gate structure body consists of a plurality of layers having mutually different channel length direction widths.

5. A field effect transistor, comprising:

a semiconductor layer protruding from a substrate plane, a gate structure body comprising a gate electrode extending from one side surface through a top surface to the other side surface of the semiconductor layer such that it strides over the semiconductor layer, on the one side surface and the other side surface of the semiconductor layer, an insulating film formed between the semiconductor layer and the gate electrode, and source/drain regions formed on both sides sandwiching the gate electrode in the semiconductor layer, wherein channel regions are formed at least in the one side surface and the other side surface of the semiconductor layer, wherein the gate structure body comprises an eaves structure which is formed by extending a protrusion which projects on each side respectively of the source and drain regions in a channel length direction and which has a channel length direction width larger than a part adjacent to the insulating film in the gate electrode, at least over the top surface of the semiconductor layer in a gate electrode extending direction, and the gate structure body has channel length direction widths which continuously decrease toward the semiconductor layer over the top surface, the one side surface and the other side surface of the semiconductor layer along normal line directions of said respective top surface, the one side surface and the other side surface of the semiconductor layer.

\* \* \* \* \*